(12) United States Patent
Steiner et al.

(10) Patent No.: US 8,996,793 B1
(45) Date of Patent: Mar. 31, 2015

(54) SYSTEM, METHOD AND COMPUTER READABLE MEDIUM FOR GENERATING SOFT INFORMATION

(75) Inventors: Avi Steiner, Kiryat Motzkin (IL); Hanan Weingarten, Herzelia (IL); Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 353 days.

(21) Appl. No.: 13/454,750

(22) Filed: Apr. 24, 2012

(51) Int. Cl.
*G06F 12/00* (2006.01)
*G06F 12/02* (2006.01)

(52) U.S. Cl.
CPC ................................ *G06F 12/0246* (2013.01)
USPC .......................................................... 711/103

(58) Field of Classification Search
None
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexish et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg et al. |
| 5,729,490 A | 3/1998 | Calligaro et al. |
| 5,740,395 A | 4/1998 | Hasbun et al. |
| 5,745,418 A | 4/1998 | Hu et al. |
| 5,778,430 A | 7/1998 | Giovannetti et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran et al. |
| 5,982,659 A | 11/1999 | Irrinki et al. |
| 6,011,741 A | 1/2000 | Harari et al. |
| 6,016,275 A | 1/2000 | Han |

(Continued)

OTHER PUBLICATIONS

Search Report of PCT Patent Application WO 2009/118720 A3.

(Continued)

*Primary Examiner* — Brian Peugh
(74) *Attorney, Agent, or Firm* — Dentons US LLP

(57) ABSTRACT

A system, a method and a non-transitory computer readable medium for generating soft information. The method may include performing a first set of read attempts of flash memory cells using a first set of read thresholds to provide first read results; calculating for each flash memory cell in response to the first read results, first cell information indicative of a first change-inducing read threshold; performing a second set of read attempts of the flash memory cells using a second set of read thresholds to provide second read results, calculating for each flash memory cell in response to the second read results, second cell information indicative of a second change-inducing read threshold; and generating, for each flash memory cell soft information in response to the first cell information and the second cell information of the flash memory cell.

22 Claims, 15 Drawing Sheets

(56) References Cited

U.S. PATENT DOCUMENTS

| | | |
|---|---|---|
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 8,693,258 B2 * | 4/2014 | Weingarten et al. ....... 365/185.2 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |

(56) References Cited

U.S. PATENT DOCUMENTS

| | | |
|---|---|---|
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.

(56) References Cited

OTHER PUBLICATIONS

Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM, METHOD AND COMPUTER READABLE MEDIUM FOR GENERATING SOFT INFORMATION

BACKGROUND OF THE INVENTION

Each flash memory cell in a NAND architecture features a transistor with a control gate and a floating gate. To store information, a charge level is written to the cell by adding a specified amount of charge to the floating gate through Fowler-Nordheim tunneling by applying a relatively large voltage to the control gate (see: R. Bez, E. Camerlenghi, A. Modelli, and A. Visconti. "Introduction to Flash Memory," Proc. IEEE, 91(4), April 2003). On a multi-level cell (MLC) flash memory the target charge level may have several values (for example 4 charge levels for a 2-bits per cell memory).

FIG. 1 illustrates a prior art flash memory cell 10 that is a part of a NAND flash memory. The flash memory cell 10 includes a transistor 10' and various lines that connect the transistor 10' to other elements of the flash memory.

The transistor 10' includes a control gate 23, a floating gate 21, a bulk (that includes a P-well 16 and two N+ regions 15 that define a substrate 16', a source 14 and a drain 13), and two oxide layers 22 and 20 that are placed between the control gate 23, the floating gate 21 and the bulk.

The control gate 21 is connected (via contact 24) to a wordline to receive wordline voltage 25, the drain 13 is connected to a sense amplifier comparator 12 that outputs a bit line signal over bit line 11. The source 14 is illustrates as being connected to a capacitance 19 that is grounded.

In order to read the flash memory cell, the charge level written to the floating gate 21 is detected by applying a specified word-line voltage 25 to the control gate 23 and measuring transistor drain current that flows through drain 13.

The drain current is compared to a current threshold by the sense amplifier comparator 12.

If the drain current is above the current threshold, then the word-line voltage 25 was sufficient to turn on the transistor 10', indicating that the charge written to the floating gate 21 was insufficient to prevent the transistor 10' from turning on. If the drain current is below the threshold, the charge added to the floating gate 21 was sufficient to prevent the applied word-line voltage 25 from turning on the transistor 10'.

The sense amplifier comparator 12 provides one bit of information about the charge level present in the floating gate 21. A bit error occurring at this threshold-comparison stage is called a raw bit error. Analog impairments of the sense amplifier comparator 12 and the threshold voltage read circuitry (not shown) introduce noise in addition to the variable charge level of the floating gate 21.

Once the reading attempt the inaccuracy of the measurement of the charge level can not be compensated in analog manners.

The word-line voltage 25 (threshold voltage) required to turn on a particular transistor can vary from cell to cell for a variety of reasons. For example, the floating gate can be overcharged during the write operation, the floating gate can lose charge due to leakage in the retention period, or the floating gate can receive extra charge when nearby cells are written.

When flash memory cells are read with multiple read thresholds then the read threshold that causes the read result of the flash memory cell to change (in comparison to the read results obtained using lower read thresholds) can be referred to as a change-inducing read threshold. The change-inducing read threshold may equal the threshold voltage required to turn on a particular transistor but may be higher then that threshold voltage.

A dominant effect, in floating gate NAND Flash technology, for change over time is known as detrapping, where there is charge leakage from the floating gate. Detrapping increases threshold voltage variance with the program erase (P/E) cycles. As the number of P/E cycles increases, the number of traps also increases.

FIG. 2 demonstrates a prior art threshold voltage distribution and various read thresholds. A single read threshold is applied per each read attempt.

The threshold voltage distribution 200 of a 2 bit per cell (bpc) flash memory page (physical page) includes four lobes—201-204. The physical page can be used for storing a Most Significant Bit (MSB) logical page and a Least Significant Bit (LSB) logical page. The MSB page can be read by a single read attempt that uses MSB read threshold Xth,1 212, where cells which correspond to threshold voltage higher than Xth,1 212 are assigned a logical '0' and all other cells are assigned a logical '1'. The LSB page can be read by using two read threshold Xth,0 211 and Xth,2 213, where all the cells which are located between these thresholds are assigned a logical '0' value, and other cells are assigned a '1'.

Since the statistical distribution of the threshold voltage changes over the Flash device life span, a read operation may require learning the statistics and only then placing the thresholds for the read operation which is used as input for the decoder. In case there are not too many errors, a hard input, obtained from a single read attempt, for the decoder may suffice once the statistics is known up to a sufficiently high accuracy. It is mainly required for setting read threshold such that a minimal number of read errors is obtained for the decoder inputs.

When there are relatively many errors, it may not be enough to provide just a single hard decision input, which is obtained by a single read, to the decoder.

In such cases, a soft decoder may be applied when soft information, or reliability information, for each bit (a read result of a single read attempt of a single flash memory cell) is provided to the decoder. This information is achieved by performing multiple read operations using different read thresholds.

In FIG. 2, for example, reading the MSB page bits with soft input may require sampling multiple times around threshold Xth,1 and to provide reliability metrics accordingly. For providing soft input to the decoder when reading the LSB page bits, it is required to perform multiple read operations around Xth,0, and Xth,2. For fast—and joint sampling of Xth,0, and Xth,2 it may be suggested to sample once around Xth,1 and then perform multiple samples around Xth,0, and Xth,2 obtained by LSB page type reads (which saves twice the number of read operations).

For soft decoding, reliability metrics called soft information per bit are required. This is obtained by performing multiple reads from the Flash, where each read operation uses different read thresholds. The read thresholds must be configured such that soft metrics, called log-likelihood ratio (LLR), or any approximation, can be computed per bit.

The definition of an LLR is $$LLR(b_i) = \log\left(\frac{P(b_i = 1 | y)}{P(b_i = -1 | y)}\right)$$

where y is the channel output and $b_i$ is the $i^{th}$ bit of some page (which is a read result of a certain flash memory cell of a physical or logical page, the read result is obtained when using a certain read threshold), and the values of $b_i$ can be '−1' or '1'.

Flash memory cells can be read by performing a high resolution read operation. The high resolution read operation typically includes multiple read attempts that involve using read thresholds that are proximate to each other. Read results and soft information are provided to an error correction decoder.

The read results can be of relatively low reliability. There is a growing need to increase the reliability of read results of flash memory cells.

SUMMARY OF THE INVENTION

According to an embodiment of the invention a method may be provided and may include performing by a flash memory controller, a first set of read attempts of flash memory cells using a first set of read thresholds to provide first read results; calculating, by the flash memory controller, for each flash memory cell of the flash memory cells and in response to the first read results, first cell information indicative of a first change-inducing read threshold; performing, by the flash memory controller, a second set of read attempts of the flash memory cells using a second set of read thresholds to provide second read results; wherein at least one read threshold of the second set of read thresholds substantially equals at least one read threshold of the first set of read thresholds; calculating, by the flash memory controller, for each flash memory cell of the flash memory cells and in response to the second read results, second cell information indicative of a second change-inducing read threshold; and generating, for each flash memory cell of the flash memory cells, soft information in response to the first cell information and the second cell information of the flash memory cell.

The first set of read thresholds may virtually partitions a threshold voltage distribution of the flash memory cells to multiple first voltage ranges; and the second set of read thresholds may virtually partition the threshold voltage distribution of the flash memory cells to multiple second voltage ranges.

Each read threshold of the second set of read thresholds may be included in the first set of read thresholds.

The first cell information of each flash memory cell may represent a first voltage range that starts by the first change-inducing read threshold. The second cell information of each flash memory cell may represent a second voltage range that starts by the second change-inducing read threshold.

The first cell information may include a first label that may represent a location of the first voltage range and the second cell information may include a second label that may represent a location of the second voltage range.

The method may include adding, for each flash memory cell, the first label and the second label to provide a combined label.

The adding may include a coherent combining, for each flash memory cell, the first label and the second label of the flash memory cell to provide the combined label of the flash memory cell.

The method may include compressing the combined label of each flash memory cell.

The method may include feeding the first label and the second label of each flash memory cell of the multiple flash memory cells to a lookup table that outputs a combined label.

The first cell information may represent a reliability of the first voltage range and wherein the second cell information may represent a reliability of the second voltage range.

The first cell information may include a first log likelihood ratio (LLR) value associated with the first voltage range.

The method may include adding, for each flash memory cell, the first LLR value and the second LLR value to provide a combined LLR value.

The may include a coherent combining, for each flash memory cell, of the first LLR value and the second LLR value to provide a combined LLR value.

The method may include compressing the combined LLR value.

The second set of read thresholds can be a subset of the first set of read thresholds. The method may include selecting the second read thresholds in response to an estimated reliability of first voltage ranges.

The method may include selecting second read thresholds associated with first voltage ranges that exhibit a reliability that is smaller than a reliability threshold.

The method may include determining an amount of second read thresholds to be applied during the second set of read attempts based upon an outcome of an at least partial soft decoding attempt that is applied on the first read results.

The method may include performing an additional set of read attempts of the flash memory cells using an additional set of read thresholds to provide additional read results; wherein at least one additional read threshold of the additional set of read thresholds substantially equals at least one read thresholds of the first set of read thresholds; calculating, by the flash memory controller, for each flash memory cell and in response to the additional read results, additional cell information indicative of an additional change-inducing read threshold; and generating, for each flash memory cell, soft information in response to the first, second and additional cell information of the flash memory cell.

The method may include performing at least a partial soft decoding attempt after a completion of a re-sampling iteration; wherein the re-sampling iteration may include the performing of the additional set of read attempts, the calculating of the additional cell information and the generating of the soft information; and determining whether to perform a further re-sampling iteration based upon an amount of success of the at least partial soft decoding attempt.

The method may include determining to perform the further re-sampling iteration until the at least partial soft decoding attempt succeeds.

The method may include determining at least one parameter of the second set of read attempts in response to a state of the flash memory cells.

Further embodiments of the invention include a computer readable medium that is non-transitory and may store instructions for performing the above-described methods and any steps thereof, including any combinations of same. For example, the computer readable medium may store instructions for performing a first set of read attempts of flash memory cells using a first set of read thresholds to provide first read results; calculating for each flash memory cell of the flash memory cells and in response to the first read results, first cell information indicative of a first change-inducing read threshold; performing a second set of read attempts of the flash memory cells using a second set of read thresholds to provide second read results; wherein at least one read threshold of the second set of read thresholds substantially equals at least one read threshold of the first set of read thresholds; calculating, for each flash memory cell of the flash memory cells and in response to the second read results, second cell information indicative of a second change-inducing read threshold; and generating, for each flash memory cell of the flash memory cells, soft information in response to the first cell information and the second cell information of the flash memory cell.

The first set of read thresholds may virtually partitions a threshold voltage distribution of the flash memory cells to multiple first voltage ranges; and the second set of read thresholds may virtually partition the threshold voltage distribution of the flash memory cells to multiple second voltage ranges.

Each read threshold of the second set of read thresholds may be included in the first set of read thresholds.

The first cell information of each flash memory cell may represent a first voltage range that starts by the first change-inducing read threshold. The second cell information of each flash memory cell may represent a second voltage range that starts by the second change-inducing read threshold.

The first cell information may include a first label that may represent a location of the first voltage range and the second cell information may include a second label that may represent a location of the second voltage range.

The non-transitory computer readable medium may store instructions for adding, for each flash memory cell, the first label and the second label to provide a combined label.

The adding may include a coherent combining, for each flash memory cell, the first label and the second label of the flash memory cell to provide the combined label of the flash memory cell.

The non-transitory computer readable medium may store instructions for compressing the combined label of each flash memory cell.

The non-transitory computer readable medium may store instructions for feeding the first label and the second label of each flash memory cell of the multiple flash memory cells to a lookup table that outputs a combined label.

The first cell information may represent a reliability of the first voltage range and wherein the second cell information may represent a reliability of the second voltage range.

The first cell information may include a first log likelihood ratio (LLR) value associated with the first voltage range.

The non-transitory computer readable medium may store instructions for adding, for each flash memory cell, the first LLR value and the second LLR value to provide a combined LLR value.

The may include a coherent combining, for each flash memory cell, of the first LLR value and the second LLR value to provide a combined LLR value.

The non-transitory computer readable medium may store instructions for compressing the combined LLR value.

The second set of read thresholds can be a subset of the first set of read thresholds. The non-transitory computer readable medium may store instructions for selecting the second read thresholds in response to an estimated reliability of first voltage ranges.

The non-transitory computer readable medium may store instructions for selecting second read thresholds associated with first voltage ranges that exhibit a reliability that is smaller than a reliability threshold.

The non-transitory computer readable medium may store instructions for determining an amount of second read thresholds to be applied during the second set of read attempts based upon an outcome of an at least partial soft decoding attempt that is applied on the first read results.

The non-transitory computer readable medium may store instructions for performing an additional set of read attempts of the flash memory cells using an additional set of read thresholds to provide additional read results; wherein at least one additional read threshold of the additional set of read thresholds substantially equals at least one read thresholds of the first set of read thresholds; calculating, by the flash memory controller, for each flash memory cell and in response to the additional read results, additional cell information indicative of an additional change-inducing read threshold; and generating, for each flash memory cell, soft information in response to the first, second and additional cell information of the flash memory cell.

The non-transitory computer readable medium may store instructions for performing at least a partial soft decoding attempt after a completion of a re-sampling iteration; wherein the re-sampling iteration may include the performing of the additional set of read attempts, the calculating of the additional cell information and the generating of the soft information; and determining whether to perform a further re-sampling iteration based upon an amount of success of the at least partial soft decoding attempt.

The non-transitory computer readable medium may store instructions for determining to perform the further re-sampling iteration until the at least partial soft decoding attempt succeeds.

The non-transitory computer readable medium may store instructions for determining at least one parameter of the second set of read attempts in response to a state of the flash memory cells.

Additional embodiments of the invention include a system arranged to execute any or all of the methods described above, including any stages—and any combinations of same. For example, the system may include (i) a flash memory controller that may include a read circuit that is arranged to perform: (a) a first set of read attempts of flash memory cells using a first set of read thresholds to provide first read results; and (b) a second set of read attempts of the flash memory cells using a second set of read thresholds to provide second read results; wherein at least one read threshold of the second set of read thresholds substantially equals at least one read threshold of the first set of read thresholds; and (ii) a soft information circuit arranged to: (a) calculate, for each flash memory cell of the flash memory cells and in response to the first read results, first cell information indicative of a first change-inducing read threshold; (b) calculate, for each flash memory cell of the flash memory cells and in response to the second read results, second cell information indicative of a second change-inducing read threshold; and (c) generate, for each flash memory cell of the flash memory cells, soft information in response to the first cell information and the second cell information of the flash memory cell.

The first set of read thresholds may virtually partitions a threshold voltage distribution of the flash memory cells to multiple first voltage ranges; and the second set of read thresholds may virtually partition the threshold voltage distribution of the flash memory cells to multiple second voltage ranges.

Each read threshold of the second set of read thresholds may be included in the first set of read thresholds.

The first cell information of each flash memory cell may represent a first voltage range that starts by the first change-inducing read threshold. The second cell information of each flash memory cell may represent a second voltage range that starts by the second change-inducing read threshold.

The first cell information may include a first label that may represent a location of the first voltage range and the second cell information may include a second label that may represent a location of the second voltage range.

The soft information circuit may be arranged to add, for each flash memory cell, the first label and the second label to provide a combined label.

The soft information circuit may be arranged to perform a coherent combining, for each flash memory cell, the first label and the second label of the flash memory cell to provide the combined label of the flash memory cell.

The soft information circuit may be arranged to compress the combined label of each flash memory cell.

The soft information circuit may be arranged to feed the first label and the second label of each flash memory cell of the multiple flash memory cells to a lookup table that outputs a combined label.

The first cell information may represent a reliability of the first voltage range and wherein the second cell information may represent a reliability of the second voltage range.

The first cell information may include a first log likelihood ratio (LLR) value associated with the first voltage range.

The soft information circuit may be arranged to add, for each flash memory cell, the first LLR value and the second LLR value to provide a combined LLR value.

The soft information circuit may be arranged to perform a coherent combining, for each flash memory cell, of the first LLR value and the second LLR value to provide a combined LLR value.

The soft information circuit may be arranged to compress the combined LLR value.

The second set of read thresholds can be a subset of the first set of read thresholds. The flash memory controller may be arranged to select the second read thresholds in response to an estimated reliability of first voltage ranges.

The flash memory controller may be arranged to select second read thresholds associated with first voltage ranges that exhibit a reliability that is smaller than a reliability threshold.

The flash memory controller may be arranged to determine an amount of second read thresholds to be applied during the second set of read attempts based upon an outcome of an at least partial soft decoding attempt that is applied on the first read results.

The read circuit may be arranged to perform an additional set of read attempts of the flash memory cells using an additional set of read thresholds to provide additional read results; wherein at least one additional read threshold of the additional set of read thresholds substantially equals at least one read thresholds of the first set of read thresholds; wherein the soft information circuit may be arranged to calculate, for each flash memory cell and in response to the additional read results, additional cell information indicative of an additional change-inducing read threshold; and generate, for each flash memory cell, soft information in response to the first, second and additional cell information of the flash memory cell.

The flash memory controller may include a decoder or may be connected to a decoder that may be arranged to perform at least a partial soft decoding attempt after a completion of a re-sampling iteration; wherein the flash memory controller may execute the re-sampling iteration by performing of the additional set of read attempts, the calculate of the additional cell information and the generating of the soft information; and determine whether to perform a further re-sampling iteration based upon an amount of success of the at least partial soft decoding attempt.

The flash memory controller may be arranged to determine to perform the further re-sampling iteration until the at least partial soft decoding attempt succeeds.

The flash memory controller may be arranged to determine at least one parameter of the second set of read attempts in response to a state of the flash memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
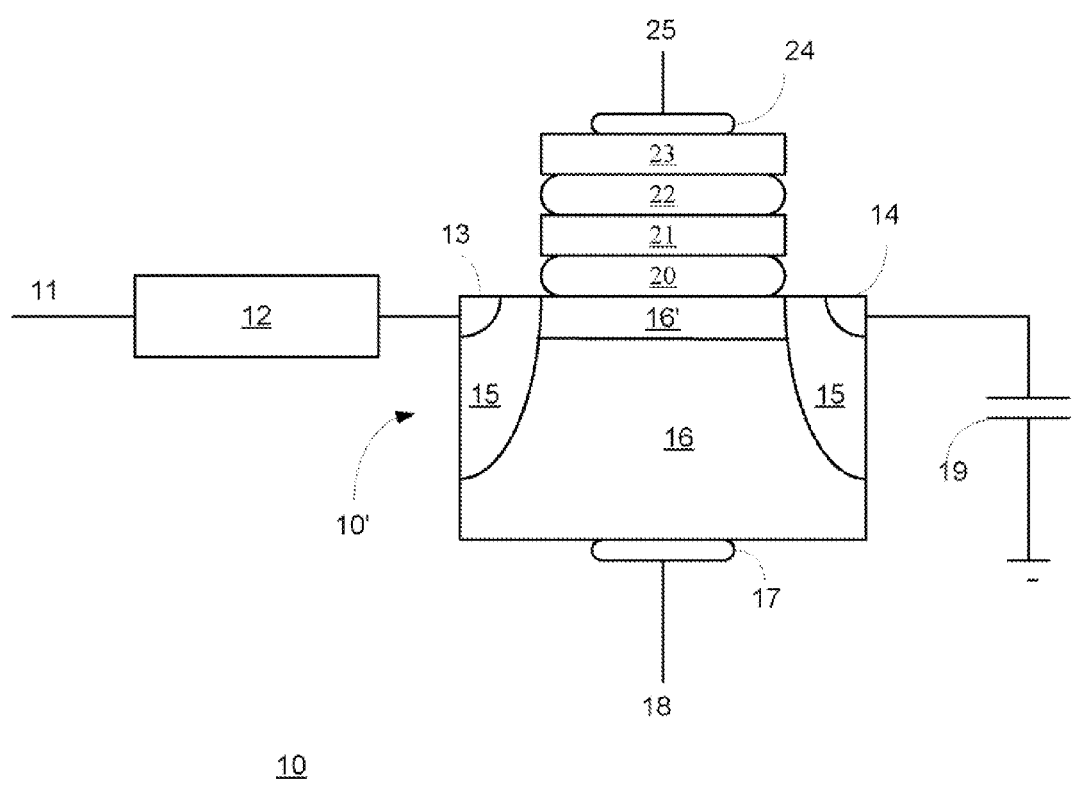
FIG. 1 illustrates a prior art flash memory cell.
Figure 2:
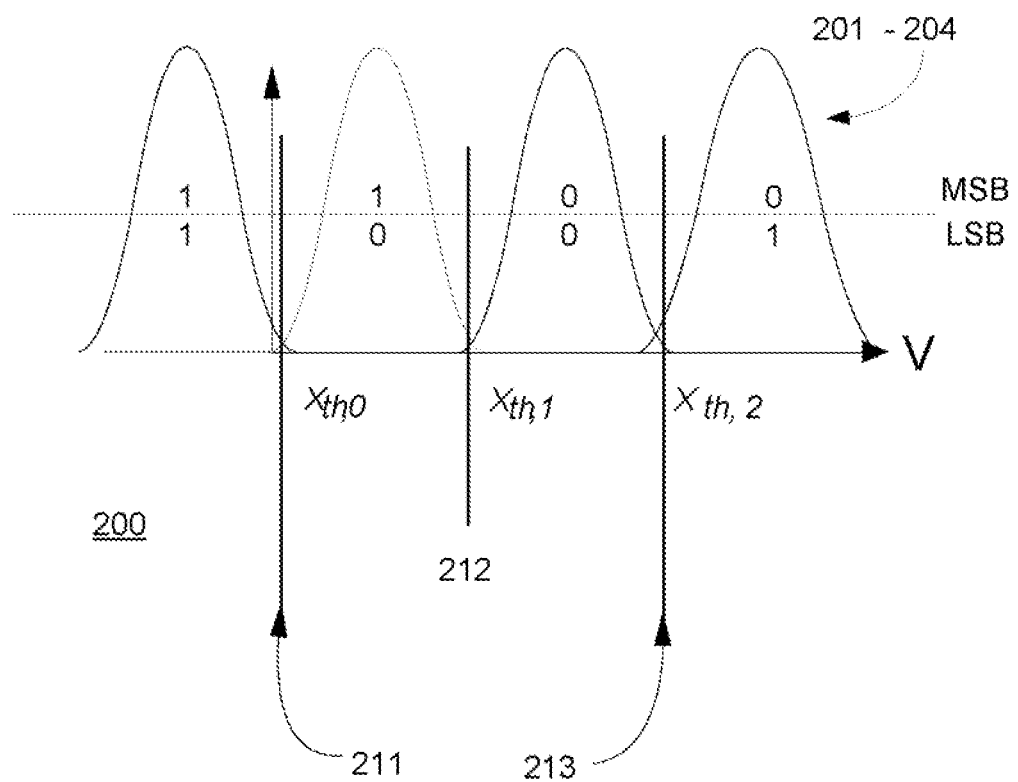
FIG. 2 illustrates a prior art threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The following terms may be construed either in accordance with any definition thereof appearing in the prior art literature or in accordance with the specification, or as follows:

Bit error rate (BER): a parameter that may express the proportion of wrongly read bits (wrongly read bits/total number of bits). For example, the readout BER from a Flash memory device is expected to be smaller than $10^{-15}$ during the stipulated lifetime of the flash memory device e.g. 10 years.

Flash memory cell: a component of flash memory that stores one bit of information (in single-level cell devices) or n bits of information (in a multi-level device having $2^n$ levels). Typically, each cell includes a floating-gate transistor. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Flash memory: a non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a page full of data, which has typically been defined by a host (data source/destination) or user thereof, as a page, and which is sent by the host to a flash memory device for storage and is subsequently read by the host from the flash memory device.

Physical Page: a portion, typically 512 or 2048 or 4096 bytes in size, of a flash memory e.g. a NAND or NOR flash memory device. Writing and reading is typically performed physical page by physical page, as opposed to erasing which can be performed only at a granularity of an erase sector. A few bytes, typically 16-32 for every 512 data bytes are associated with each page (typically 16, 64 or 128 per page), for storage of error correction information. A typical block may include 32 512-byte pages or 64 2048-byte pages or 256 8 Kbyte pages.

Alternatively, a physical page is an ordered set (e.g. sequence or array) of flash memory cells which are all written in simultaneously by each write operation, the set typically comprising a predetermined number of typically physically adjacent flash memory cells containing actual data written by and subsequently read by the host, as well as, typical error correction information and back pointers used for recognizing the true address of a page.

Threshold voltage: the voltage against which the charge level of a cell is measured. For example, a cell may be said to store a particular digital n-tuple D if the charge level or other physical level of the cell falls between two threshold values T.

In the present specification, the terms "row" and "column" refer to rows of cells and columns of cells, respectively and are not references to sub-divisions of a logical page.

The term "MSB" is used herein to denote the bit which is programmed into a multi-level cell, storing several bits, first. The term "LSB" is used herein to denote the bit which is programmed into the multi-level cell, last. The term "CSB" is used herein to denote the bit which is programmed into a 3-level cell, storing 3 bits, second, i.e. after the MSB and before the LSB. It is appreciated that more generally, e.g. if the multi-level cell stores 4 or more levels, there are more than one CSB and use of the term "CSB" herein, which implies that the cell is a 3-level cell, is merely by way of example and is not intended to be limiting.

High resolution sampling: samplings using read thresholds that are proximate to each other—so that a difference between adjacent read thresholds may be smaller (and even much smaller) than a width of a threshold voltage distribution lobe. The distance can be 1/x of the width of the threshold voltage distribution lobe, wherein x may exceed 2. Typical values of x may range between 4 and 20. Usually, the high resolution sampling is done in order to obtain soft information per cell, which describes a probability that a cell bit has a logical value 0 or 1.

Sample: read result of one or more flash memory cells. Sampling is a read operation or a read attempt around a set of thresholds (a single threshold as a special case). Re-sampling refers to an additional set of read attempts performed on flash memory cells that were already read. Assuming that the flash memory cells were already read by using a certain set of read thresholds then during the re-sampling the certain set of read thresholds may be used, a sub-set of the certain set of read thresholds may be used or slightly different read thresholds may be used.

The terms "cell" and "flash memory cell" are used generally interchangeably.

According to various embodiments of the invention there are provided a method, a flash memory controller and a non-transitory computer readable medium for increasing the reliability of read operations by mitigation of sampling noise. The sampling noise can be mitigated by re-sampling the flash memory cells and combining previous samples with previous reads.

According to various embodiments of the invention soft information may be obtained by combining cell information that reflects new read results with cell information that reflects previous read results of the same flash memory cells.

The re-sampling may reduce noise resulting from flash sense amplifiers that are used to read the content of flash memory cells. A combining of information obtained from previous samples with information obtained from new samples—both obtained using the same read threshold—reduces the effect of the noise of the flash sense amplifiers. This way the error correction code (ECC) decoder deals with an improved signal to noise ratio (SNR) at its input, meaning that the BER at the ECC input can be reduced by applying re-sampling, according to embodiments of this invention.

The manner (read parameters) in which sampling and, additionally or alternatively re-sampling should be executed can be determined based upon a state of the flash memory cells. The state can be estimated by the number of program erase cycles of the flash memory cells, or by RBER estimation. There are several ways to obtain an RBER estimation: 1) Wear level estimation by computing a histogram of a single read attempt; 2) Partial decoding activation, which performs for example a single iteration, and counts the number of errors correctable on the first iteration; etc.

There are provided methods, flash memory controllers and non-transitory computer readable media that may allow optimal (or sub-optimal) combining of cell information relating to different read attempts that use the same read thresholds for reading the same flash memory cells. A read parameter can be the number of read thresholds, the number or read attempts, the identity of the read thresholds, the number of re-sampling attempts and the like.

The cell information that reflects the outcome of many read operations can be more compact than the read results of the read attempts and may save memory space in the controller once saved instead of the read results themselves.

The cell information can have many formats. It may be a label, a Log Likelihood Ratio (LLR) value or an LLR approximation, or any other format. It can be compressed by quantization or other techniques. For simplicity of explanation the following text will refer to label or LLR. The label may represent the LLR through a look-up table (LUT). Usually the LLR requires higher precision with a higher dynamic range, and therefore the label buffers may be viewed as storing a type of compressed LLR values.

According to various embodiments of the invention re-sampling can be employed on an entire set of read thresholds or on a subset of the read thresholds.

The methods, flash memory controllers and non-transitory computer readable may enable higher performance, since a smaller penalty of sampling is paid. This may also enable reading only part of the codeword associated with lower reliability labels from the initial sampling.

The cell information may be generated on the fly and after every read attempt. The cell information can be compressed by quantization, truncated weighted sum, rounding, averaging or any other technique.

According to an embodiment of the invention the re-sampling is done with the same read thresholds. According to another embodiment of the invention the re-sampling can be done with slightly different (nearby) read thresholds. That is, instead of repeating the sampling using identical read thresholds, the read threshold setting for every sampling changes within a small neighborhood.

According to an embodiment of the invention a re-sampling can be executed if a hard decoding attempt fails, if a soft decoding attempt fails, if a partial soft decoding attempt fails, if it is expected that a hard or soft decoding attempt will fail or if a decoding attempt (soft or hard, partial or complete) is likely to take too much time.

Yet according to an embodiment of the invention the manner in which to perform the re-sampling (for example—how many read thresholds to apply, which read thresholds to apply, whether to use an entire set of read thresholds or only a sub-set) is responsive to an amount of success in a decoding attempt (hard or soft, partial of complete).

According to another embodiment of the invention, the manner in which to perform the re-sampling is responsive to a Flash device state, e.g. the number of P/E cycles and estimated wear state (which estimates the retention effect when read operation is executed), which correspond to RBER estimation. There are several ways to obtain an RBER estimation: 1) Wear level estimation by computing a histogram of a single read attempt; 2) Partial decoding activation, which performs for example a single iteration, and counts the number of errors correctable on the first iteration;

Cell information obtained during different sets of read attempts which refer to the same flash memory cell and to substantially the same read thresholds can be coherently combined. For example, LLRs obtained at different read operations for same read threshold and for the same flash memory cells can be coherently combined to provide combined LLRs (also referred to as combined results). The combined results can be saved using labels representing the combined LLRs—this minimizes the storage requirement of the multiple read operations in the memory controller.

The re-sampling is not limited to refinement of sampling resolution. In fact, the sampling resolution may slightly change or may not change at all. Rather, re-sampling may be done to overcome sampling noise and may be combined with previous sampling results to obtain less noisy samples. Furthermore, unlike prior art, the re-sampling may be done only on a portion of the sampling points, only those relevant to reduce the sampling noise.

The flash memory controllers, non-transitory computer readable media and methods may take into account a model of a flash memory cell and its surroundings.

Linear Expression for LLR

The LLR expression can be substantially simplified, for an additive white Gaussian noise (AWGN) channel model. The AWGN is also a good approximation in many cases for the Flash lobes' distribution. By assuming an AWGN channel, $$P(b_i | y) = \frac{1}{\sqrt{2\pi\sigma^2}} \exp\left(-\frac{(y-b_i)^2}{2\sigma^2}\right)$$

where y is the AWGN channel output, and $\sigma^2$ is the additive noise variance.

The LLR is defined as $$LLR(b_i) = \log\left(\frac{P(b_i = 1 | y)}{P(b_i = -1 | y)}\right)$$

where $b_i$ is the $i^{th}$ bit, and the values of $b_i$ can be '−1' or '1'. Accordingly—LLR(bi) becomes $$LLR(b_i) = \frac{2y}{\sigma^2}$$

where the LLR per bit is created during the multiple Flash reads, as a quantized version of an AWGN channel. The noise models of a Flash memory may be slightly different from an AWGN, and thus the exemplified LLR may be just an approximation. Under different noise models the LLR may be computed according to the actual Flash noise model.

The quantization level per threshold is directly determined by the number of reads, as the base-two logarithm of the read counter. Once, the multiple reads have been conducted, and LLRs are available for all codewords bits, the decoding process begins. There are many possible approximations for LLR values mapping for implementation efficiency, such as mapping to fixed point integer values. These can be used also for adaptation of LLR to flash memory noise model.

Iterative soft decoding for the multidimensional code presented in U.S. patent application Ser. No. 13/036,796 filing date Feb. 28, 2011 and includes the process of performing soft decoding, and applying the most likely corrections (under different conditions, as will be elaborated here). A decoding may include performing a soft decoding operation per component code, obtaining a soft output result per component. On some code components it may be desired to perform only hard decoding. An example for such code can be a 3D code where the outer components are BCH codes which correct t>4 errors. If this code has inner-1 and inner-2 BCH components with decoding capability of t≤4, then soft decoding may be efficiently implemented here (in terms of computational complexity, or hardware implementation).

The soft decoding for a component code may include a notation of Sphere decoding. In particular, when using a BCH component code, this can include creating a list of candidates of the most likely error hypotheses. Perform BCH decoding for every candidate in the list, and compute a soft score for every decoding result by, for example, $$S_{LLR} = \sum_{b_m \in C} |LLR(b_m)|$$

where C is the set of error bits, and $b_m$ is a location of an error bit. Typically, the selected error hypothesis of a soft component decoder has the smallest $S_{LLR}$ score.

Flash Readout Channel Model

Consider the following channel model for sampling the Flash device with a given set of thresholds $y_1 = \underline{v}_b + \underline{n}_c + \underline{n}_a$ where $y_t$ is the readout vector from the Flash memory, $\underline{v}_b$ is the discrete voltage level vector associated with the target levels of the original information stored in the memory.

The additive noise has two main components, $\underline{n}_c$ is the noise associated with the charge level inaccuracy. This noise originates from neighboring cells' coupling effects during programming, leakage over time due to retention, and others. The second noise component $\underline{n}_a$ is the noise associated with the analog impairments of the read operation.

The noise components' distributions may vary among Flash vendors and across memory processes. A good approximation for their distribution is usually a Gaussian distribution. The distribution of every element in the vector $\underline{n}_a$ is independent and identically distributed (iid) with a zero mean and variance $\sigma_a^2$. When modeled as a Gaussian distribution, the element distribution is denoted by $n_a \sim N(0, \sigma_a^2)$. An important property of the different noise components is that the charge noise $\underline{n}_c$ remains fixed over multiple consecutive read operations from the same page, while the realization of $\underline{n}_a$ changes independently between consecutive reads. This can be formalized by the following model.

Consider a sequence of N reads from the same page, $y_t^i = \underline{v}_b^i + \underline{n}_c^i + \underline{n}_a^i$ where $y_t^i$ is the readout vector from the Flash memory at the i'th read attempt, where i=1, ..., N. All N read attempts are from the same page, some of the elements in $y_t^i$ do not change, since the read operations are performed one after the other, as to be serving the same read operation, and having no retention effect between those readouts.

The readout vector can be thus written as $y_t^i = \underline{v}_b + \underline{n}_c + \underline{n}_a^i$ where $y_t^i$ is the readout vector from the Flash memory at the i'th read attempt, where i=1, ..., N. The discrete voltage level vector $\underline{v}_b$ is unchanged and the charge level noise $\underline{n}_c$ is unchanged. Only the analog sampling noise vector $\underline{n}_a^i$ is approximately iid and changes from one read to another according to its distribution.

Using multiple read results, it may be beneficial to combine all the read results in order to minimize the sampling noise effect. The optimal combining which maximizes the signal to noise (SNR) of the desired page values w.r.t. the noise elements is a simple weighted sum of the readouts, which is similar to coherent combining in a communication system. The controller can perform maximal ratio combining (MRC) of the different read attempts, just like the chase combining Hybrid automatic repeat request (HARQ) protocols work (see: Frenger, P.; S. Parkvall and E. Dahlman (October 2001). "Performance comparison of HARQ with Chase combining and incremental redundancy for HSDPA". *Vehicular Technology Conference*, 2001. VTC 2001 Fall. IEEE VTS 54th. 3. Piscataway Township, N.J.: IEEE Operations Center. pp. 1829-1833)

The multiple read operations can be thought of as retransmissions in a communications' system, and the combining as the chase combining ARQ which is essentially the same.

The Flash memory channel model is in a way simplified compared to a communications channel model, and in order to obtain a coherent combining of the read attempts, it is simply required to sum up to read results, and then start the processing. The coherently combined signal of read attempts is given by $$\sum_{i=1}^{N} y_t^i = \sum_{i=1}^{N} (\underline{v}_b + \underline{n}_c + \underline{n}_a^i) = N(\underline{v}_b + \underline{n}_c) + \sum_{i=1}^{N} \underline{n}_a^i,$$

where the discrete voltage level vector $\underline{v}_b$ is unchanged and the charge level noise $\underline{n}_c$ is unchanged across all sampling. Only the analog sampling noise vector $\underline{n}_a^i$ is approximately iid and changes from one read to another according to its distribution The SNR of the combined signal is thus given as $$SNR = \frac{N^2 \sigma_b^2}{N^2 \sigma_c^2 + N \sigma_a^2} = \frac{N \sigma_b^2}{N \sigma_c^2 + \sigma_a^2}$$

As may be noticed the gain of coherent combining comes from the independence of noise samples of $\underline{n}_a$ from one read to the other.

In a Flash memory controller, there is usually a limited amount of memory for storage of high resolution read results.

As an embodiment of the invention, it is suggested to perform coherent combining on the digital realizations of the samples in a compacted form. A set of read results is stored by its labels, i.e. a set of 32 reads of a certain page can be stored with a 5-bit label where each label indicates the threshold associated with the change of a certain cell. The read results are mapped to LLR values, by for example using the mapping $$LLR(b_i) = \frac{2(y - v_{msb})}{\sigma^2}$$

as explained above, where $v_{msb}$ is the voltage associated with optimal read threshold. In order to implement the combining of soft information, it is suggested to store the labels of previous read, and perform a new set of reads resulting in a new set of labels. The combining of the results can be done by assigning new label values to the results of the sum LLR values of the two read sets. Generally speaking, if, for example, every label uses 4 bits, then the maximal number of bits required after combining of two sets of reads is 5 bits for the representation. Like may be noticed from the LLR approximate equation, the sum of LLR values for combining the previous set of samples and current set of samples is actually a coherent combining operation.

Figure 3:
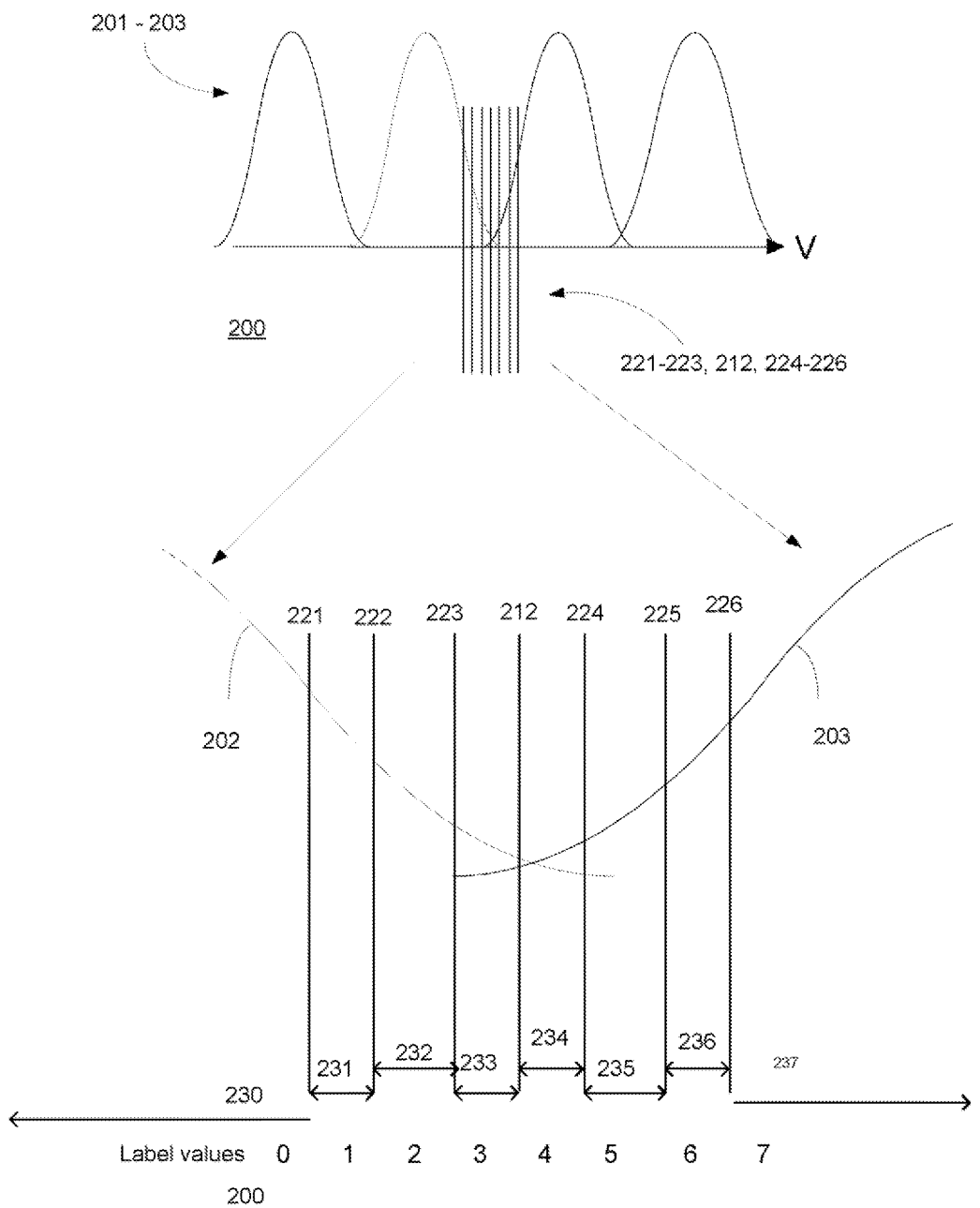
FIG. 3 illustrates a threshold voltage distribution, and a soft sampling set of thresholds according to an embodiment of the invention.

FIG. 3 illustrates a threshold voltage distribution of a 2-bit per cell Flash memory.

An MSB page may be read according to an embodiment of the invention by a set of read attempts, each read attempt uses a unique read threshold.

FIG. 3 illustrates read thresholds 221-227 that include MSB threshold Xth,1 212 and additional read thresholds 221-223 and 224-226 that are located at both sides of MSB threshold Xth,1 212.

These seven read thresholds virtually partition the threshold voltage distribution to eight voltage ranges 230-237 that are associated with labels 0 to 7 respectively.

The set of read attempts provide a high resolution sampling of the flash memory cells of the page. A single read result of a single flash memory cell of a single read attempt can be either zero or one. The outcome of the seven read attempts (the read results) can be processed in order to determine what is the change-inducing read threshold for each flash memory cells—and what is the voltage range associated with that flash memory cell.

For example, flash memory cells that their threshold voltage belongs to voltage range 231 had their transistor turned on by read threshold 221. A label assigned to these flash memory cells can have a value of "1". Yet for another example, flash memory cells that their threshold voltage belongs to voltage range 232 had their transistor turned on by read threshold 222. A label assigned to these flash memory cells can have a value of "2".

Each label can be represented by 3 bits. When multiple (more than 3) read attempts are executed this 3-bit label is more compact than the aggregate read results.

Every label may be associated with an LLR value. The soft information for the decoder can be the label, the LLR value or any other reliability information. The mapping between labels and LLR values can be derived from a look up table (LUT), calculated on the fly or can be derived in other manners.

Figure 4:
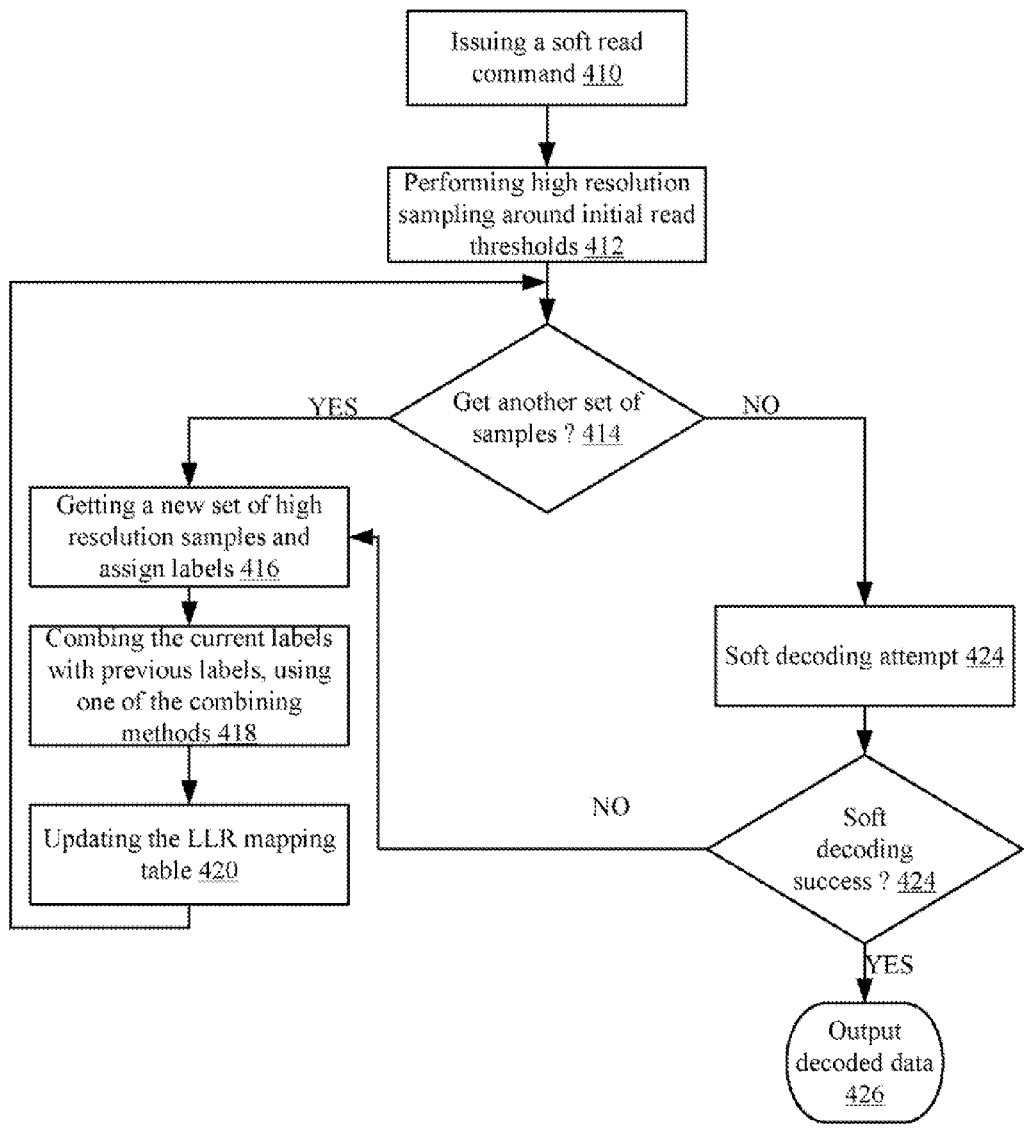
FIG. 4 illustrates a method according to an embodiment of the invention.

FIG. 4 provides a flowchart of the soft read process using multiple read re-sampling and combining of the read results, according to an embodiment of the invention.

Once a soft read command is issued (410), an initial high resolution sampling is done (412) to get read results from which cell information such as initial soft information per bit can be calculated. This can be done using the read thresholds of FIG. 3.

Using the available samples, a decision (416) whether to perform another sampling process is to be taken. This can be done according to one of the following rules:
a. If the soft decoding fails, takes too long, or is likely to fail.
b. According to the LLR distribution. That is, a coarse estimation of the standard deviation (STD) per lobe can be obtained from the samples. This can help assess the initial SNR or initial raw bit error rate (RBER), where the RBER is the error rate of the hard decision at the ECC input. When the estimated RBER is sufficiently low (below a threshold), the soft decoding attempt may start without additional sampling and combining. There are several ways to obtain an RBER estimation: 1) wear level estimation by computing a histogram of a single read attempt; 2) Partial decoding activation, which performs for example a single iteration, and counts the number of errors correctable on the first iteration;

If a decision is made not to get another set of samples ("NO"), then stage 416 is followed by performing (422) a soft decoding attempt and checking (424) if the soft decoding attempt succeeded. If the soft decoding succeeded then outputting (424) decoded data. Else (if failed) the soft decoding attempt may be followed by re-sampling (416).

If a decision is made to get another set of samples ("YES"), then the read is done again (re-sampling, stage 416) over a set of thresholds, providing new cell information. The next step is to combine (418) the current cell information samples (for example—current labels) with the new cell information (for example—new labels). The combining is followed by updating (420) an LLR mapping table indicative of a mapping between LLR values and labels. This may be followed by stage 414.

The combining (418) may include computing the sum of LLR values associated with current samples, and LLR values associated with the new samples.

Stage 420 may include creating new labels according to all possible LLR values after the summation, create new labels, corresponding to sum values.

Stage 420 may also include saving the new labels and remove all previous labels (including those generated during re-sampling and current labels)—that is, save only a single set of labels post combining. The same applied to LLR values or any other form of cell information.

Method 400 may also include normalizing the LLR values. It may sometimes be beneficial to normalize the LLR values by the number of re-sampling operations that were done.

As another embodiment of the invention, the combining of multiple LLR values can be done as follows:

$$LLR_{comb}(b) = \frac{1}{N}\sum_{i=1}^{N} LLR_i(b)$$

where $LLR_i(b)$ is the LLR associated with the bit 'b', on the i'th re-sample, and N is the number of re-sample sets that are combined.

Further approximations can be used for the sake of combining, such as $$LLR_{comb}(b) = \left\lfloor 0.5 + \frac{1}{N}\sum_{i=1}^{N} LLR_i(b) \right\rfloor$$

where $\lfloor x \rfloor$ is a floor operation on x which returns the nearest smallest integer to x, and $\lfloor 0.5+x \rfloor$ returns the rounding of x to closest integer. Such approximation, or similar ones, can be used to efficiently combine re-sampling results using fixed precision, and minimizing the memory requirement of the labels to LLRs LUT.

Figure 5:
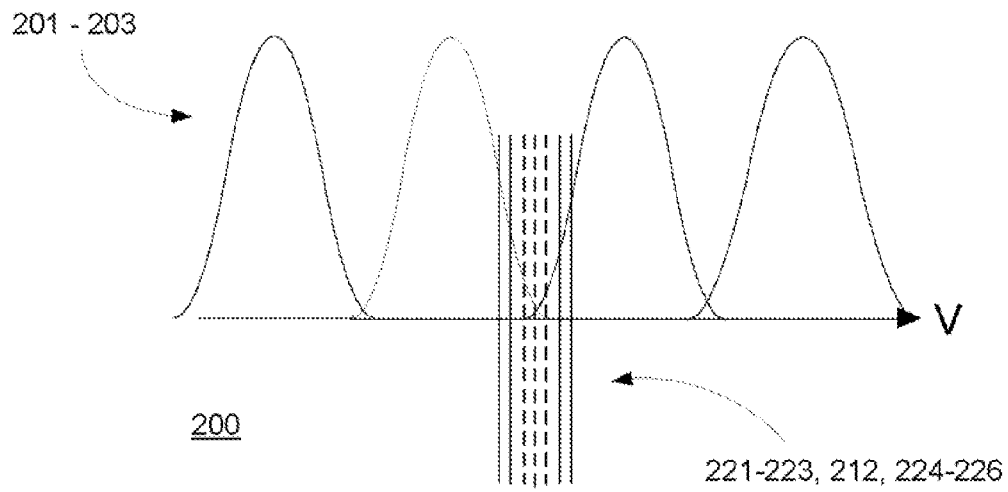
FIG. 5 illustrates a threshold voltage distribution of a 2-bit per cell Flash memory, a set of read thresholds used for sampling and a subset of the read thresholds that are used for re-sampling according to an embodiment of the invention.

FIG. 5 illustrates a threshold voltage distribution of a 2-bit per cell Flash memory, a set of read threshold used for sampling and a subset of the read thresholds that are used for re-sampling according to an embodiment of the invention.

FIG. 5 illustrates that while the sampling is done by using each one of read thresholds 221-223, 212 and 224-226, the re-sampling is done by using only a subset—read thresholds 223, 212 and 224 (all being represented by dashed lines).

This re-sampling reduced the number of read attempts and may provide a trade-off between number of read attempts and the accuracy of the soft information.

It should be noted that a soft decoder usually makes corrections in bits associated with low absolute LLR values, and naturally, the illustrated dashed thresholds are closest to optimal hard decision threshold, and are assigned the lowest LLR values. Therefore, the efficiency has only a minor degradation when performed on such subset instead of the full set of thresholds. The motivation for sub-optimal re-sampling is to reduce the overhead associated with every read attempt.

Every read attempt at a given threshold adds to the overall read operation latency, which reduces the Flash device read performance.

Figure 6:
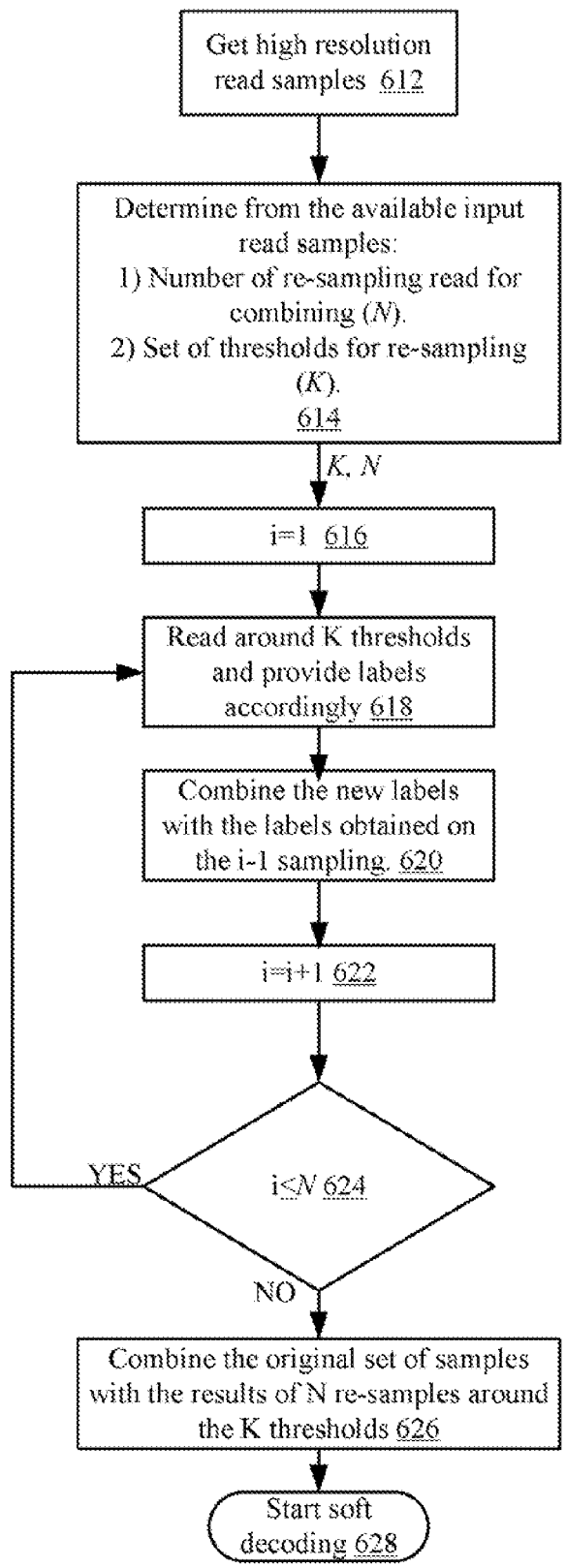
FIG. 6 illustrates a method according to an embodiment of the invention.

The combining of the cell information can be done according to method 600 of FIG. 6.

FIG. 6 illustrates method 600 according to an embodiment of the invention.

Method 600 illustrates re-sampling which can be done on a subset of thresholds. An initial high resolution sampling is done (612) to get initial soft information per bit. This can be done according to the schematic description in FIG. 3. Using the available samples, there are determined (614) the number of re-sampling operations N, and the number of read thresholds K at which the re-sampling is performed.

The N re-sampling operations may be reduced if a soft decoding attempt executed before reaching N re-sampling operations, and the decoding succeeded. Although this is not shown in FIG. 6, method may include stages such as stages 422 and 424 of method 400 that include performing a soft decoding attempt and determining whether to continue the re-sampling iterations based upon the success of the soft decoding attempt. The number of re-sampling can be determined according to the LLR distribution demonstrated in the initial sampling. That is, a coarse estimation of the standard deviation (STD) per lobe can be obtained from the samples obtained during stage 612. This can help assess the initial SNR or initial RBER. When the RBER is sufficiently low, the soft decoding attempt may start without additional sampling and combining. When high enough N may be set, for example, according to the required effective SNR improvement.

The N re-sampling operations, using K read thresholds in each re-sampling operation and combining of labels, can be executed in an iterative manner—as illustrated by stages 616, 618, 620, 622 and 624.

Stage 616 includes setting index i to 1. Index i will range between 1 and N.

Stage 618 includes performing K read attempts—each read attempt uses a different read threshold (out of K thresholds) and calculating labels. This is denoted "read around K thresholds and provide labels accordingly".

Stage 620 includes combining the new labels (obtained during the i'th re-sample operation) with the previous labels (obtained after the (i−1)'th re-sample operation.

Stage 622 includes increasing index i: i=i+1.

Stage 624 checks if index i exceeds N.

The read is done N times the set of K thresholds. Every read of K thresholds results in new labels or other form of cell information. The next step (626) after completing the N re-sampling operations is to combine the labels obtained for each flash memory.

The combining may include computing a sum of LLR values associated with current samples, and LLR values associated with new samples. Since the read is performed on a subset of K thresholds—apply the combining only to labels which were assigned values associated with the K+1 labels around the K thresholds—these are associated with the low reliability bits. Stage 626 may include generating new labels that represent the LLR values after the summation.

According to an embodiment of the invention, the combining of the LLR values associated with the K-threshold sampling can be described for example by:

$$LLR_{comb}(b) = \begin{cases} \frac{1}{N} \sum_{i=1}^{N} LLR_i(b) & b \in K_s \\ LLR_1(b) & b \notin K_s \end{cases}$$

where $LLR_i(b)$ is the LLR associated with the bit 'b', on the i'th re-sample, and N is the number of re-sample sets that are combined. The set $K_s$ is the set of bits that were originally labeled corresponding to the K-thresholds.

For example, in FIG. 5, the set $K_s$ includes the bits which were labeled on the initial sampling as $K_s=\{2,3,4,5\}$ (those whose belong to voltage ranges 233-235 and to read thresholds 223, 212 and 224) while other bits associated with labels 0,1,6,7 (read thresholds 221, 222, 223 and 226) can be considered as the more reliable bits for which re-sampling is not done, and thus combining is not applied to those bits.

As another embodiment of the invention, it is suggested to implement the combining operation by logic operations on the labels. The purpose of such implementation is to save the translation of labels into LLR values and another translation of the LLR values to labels again following a combining operation.

Figure 7:
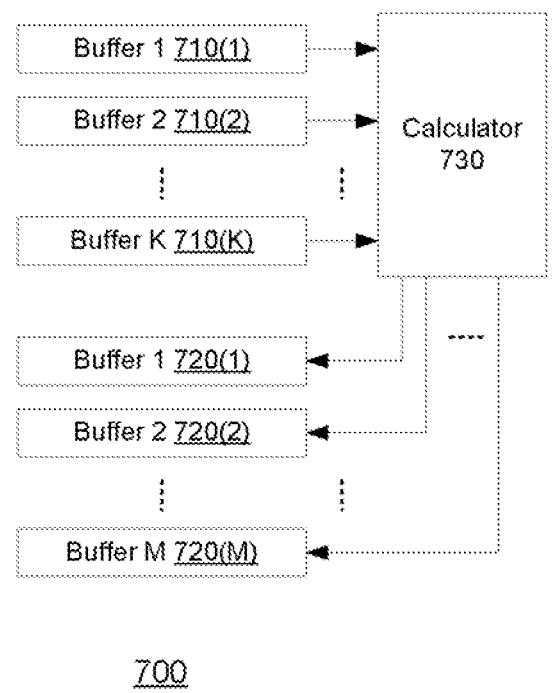
FIG. 7 illustrates a circuit according to an embodiment of the invention.

FIG. 7 illustrates a circuit 700 of a flash controller according to an embodiment of the invention.

Circuit 700 includes K input buffers 710(1)-710(K), M output buffers 720(1)-720(M) and a calculator 730.

Input buffers 710(1)-710(K) store labels. Every label uses all K buffers, i.e. in a single buffer the number of bits is equal to the codeword size (or read result size or page size).

The calculator 730 may combine applied on a set of K buffers, which results in M output buffers. In this example, the label_K to label_M mapping takes a K bit input, and provides labels of M bits, which are written to a set of M buffers. Thus, a simple implementation may include applying the LUT on every K. input bits of the K-source buffers, and writing the output into M-output buffers.

To demonstrate a combining operation of two soft read attempts, consider two equal precision sampling of K/2 bits per label. The first set of labels is stored in buffers 0, . . . , K/2, and the second set of labels (originating from a second soft read attempt) is stored in buffers K/2+1, . . . , K. Since every label is associated with an LLR value, the results of combining the two sets of labels results in LLR values which may be represented by utmost K+1 bits. Hence, the LUT mapping may be loaded in advance to correspond to any possible value of K bits, and provide an output label of M=K+1 bits per output label, to be stored in an output buffer.

As an embodiment of the invention, the output buffers may override the source buffers, in case the original sampling is not required prior to combining. Thus, instead of using K+M buffers for combining, it is possible to occupy only max(K, M) buffers.

As another embodiment of the invention, it is suggested to apply the combining of labels after every read operation. This is demonstrated in FIG. 8.

Figure 8:
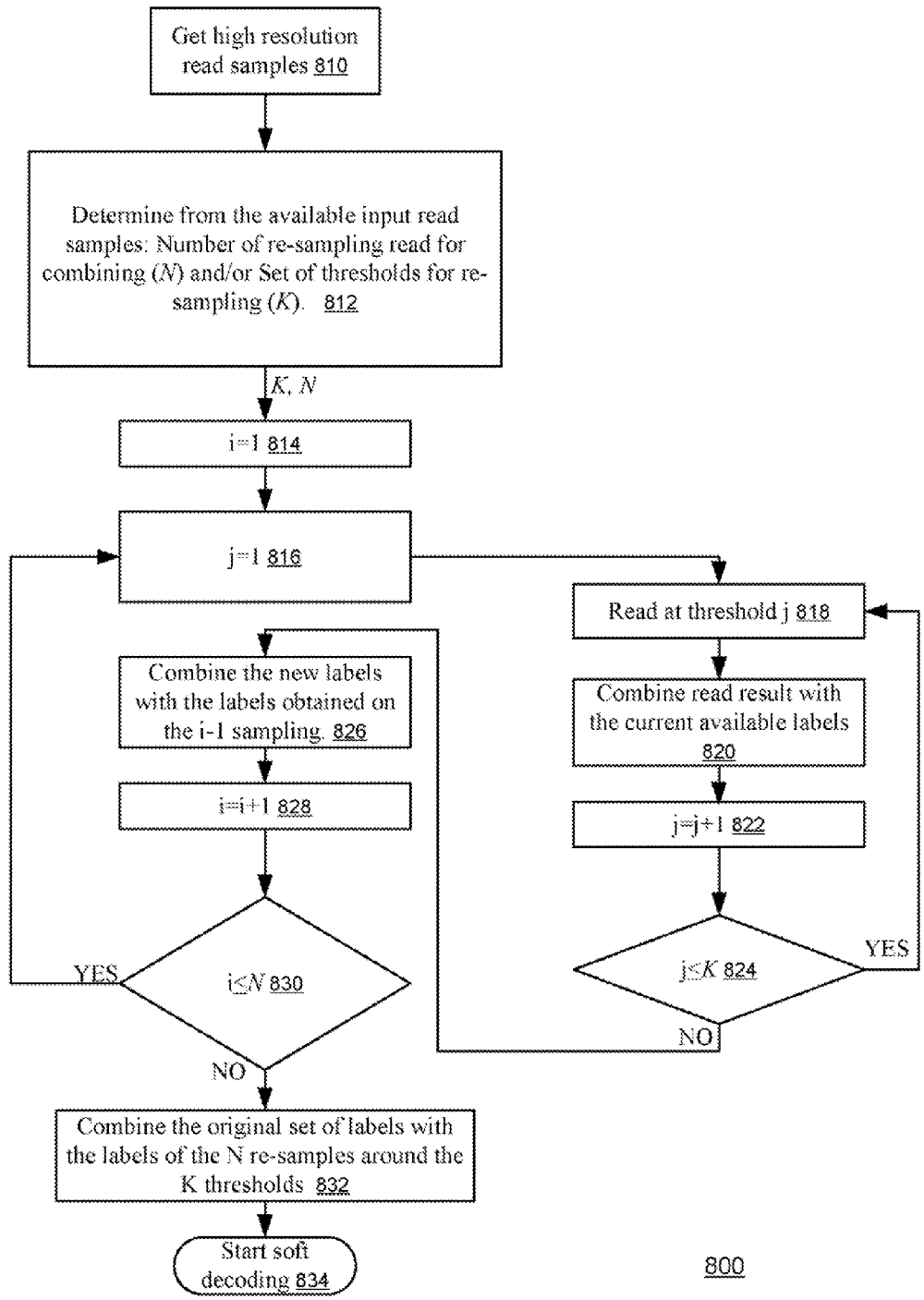
FIG. 8 illustrates a method according to an embodiment of the invention.

FIG. 8 illustrates method 800 according to an embodiment of the invention.

Method 800 include re-sampling of a subset of read thresholds which were applied during a sampling operation.

Method 800 may include labels combining for every read attempt instead of waiting for a completion of all read attempts to be executed during a single re-sampling operation.

Method 800 includes an initial high resolution sampling (810) to get initial soft information per bit. This can be done according to the schematic description in FIG. 3.

Using the available samples, a flash memory controller may determine (812) the number of re-sampling operations N, and the number of thresholds K at which the re-sampling is performed. The number of re-sampling can be determined according to the LLR distribution demonstrated in the initial sampling. That is, a coarse estimation of the standard deviation (STD) per lobe can be obtained from the samples. This can help assess the initial SNR or initial RBER. When the RBER is sufficiently low, the soft decoding attempt may start without additional sampling and combining. When high enough N>1 may be set, for example, according to the required effective SNR improvement.

The read is done N times the set of K thresholds. Every read of K thresholds results in new labeled samples. However, unlike the sampling in FIG. 6, every read attempt updates the current label set as illustrated in FIG. 7. The next step is to combine the current samples of the labels with the new K thresholds. An exemplary method can be similar to that described in FIG. 6.

Stage 812 is followed by stage 814 of setting index i to 1, stage 816 of setting index j to one, stage 818 of reading using read threshold j and calculating a new label, stage 820 of combining the new label to a previous label (associated with read threshold j) which can be a combined sum of previously calculated labels, stage 822 of increasing index j and stage 824 of checking if index j does no exceed K (if the entire K read thresholds were used). If so—stage 824 is followed by stage 818. Else (index j exceeds K)—stage 824 is followed by stage 826 of combining the new labels (calculated as a result of the i'th re-sampling operation) with labels (or sums of labels) obtained during the previous (for example—the (i–1)'th re-sampling operation). Stage 826 includes increasing index I and it is followed by stage 830 of checking if index i does exceed N. If so (i≤N) then stage 830 is followed by stage 816. If index i exceeds N then stage 830 is followed by stage 832 of combining the original set of labels (calculated as a result of stage 810) with the labels computed during the last iteration of stage 826.

Stage 832 is followed by soft decoding (834).

As another embodiment of the invention, it is suggested to reduce the accuracy of the combining of the cell information by applying compression. The goal of the compression may be a reduction of the buffer requirements for re-sampling operations. The accuracy of the LLR combining requires increasing the labels number of bits after every new soft sampling. This is since in general, the combining operation requires accumulating LLR values. After every accumulation the representation of the labels may be increased.

Figure 9:
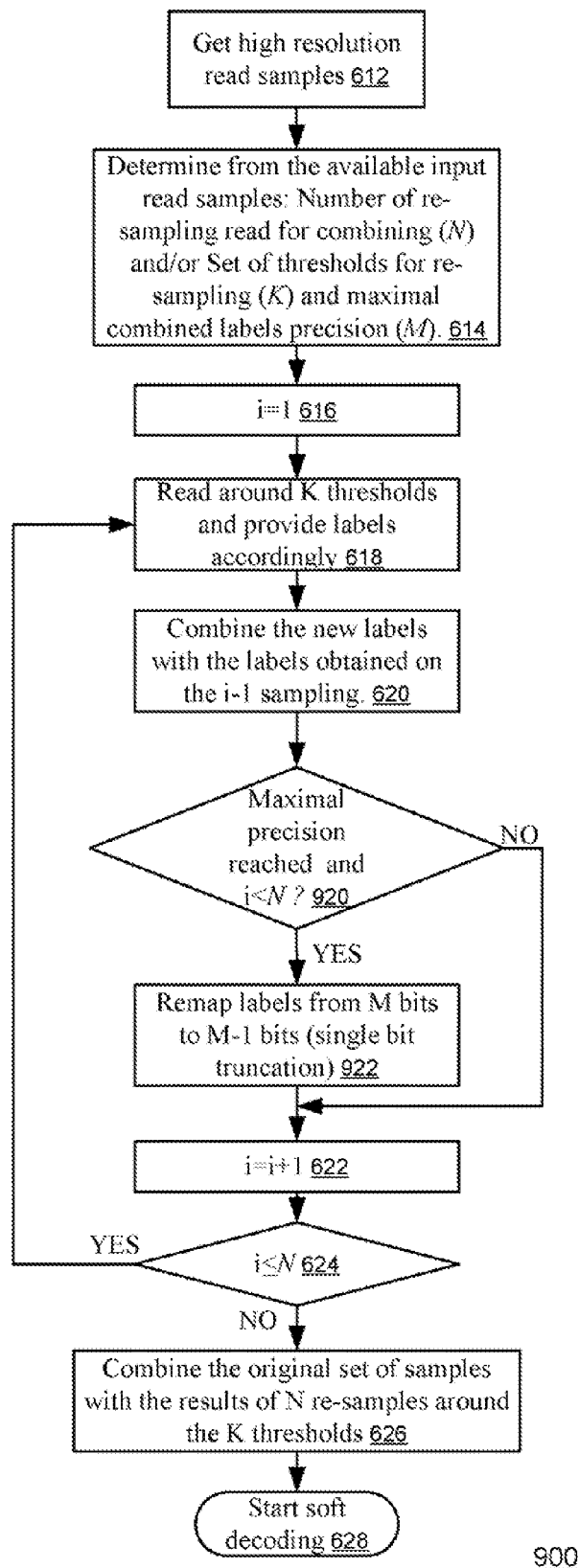
FIG. 9 illustrates a method according to an embodiment of the invention.

It is suggested to implement a truncation as illustrated in FIG. 9. FIG. 9 illustrates method 900 according to an embodiment of the invention.

Method 900 differs from method 600 by including stages 920 and 922 between stages 618 and 622.

After every soil sampling operation (which includes update of labels), it is suggested to check (920) the precision of the labels representing the combined soil information. If the labels precision reaches the maximal precision (M bits in the example in FIG. 9), and it is still required to obtain further soft re-sampling (index i is smaller than N), then the method performs a compression operation—for example applying a mapping (922) operation from M-bit labels to M–1 bit labels, which may divide the combined LLR values by 2, thus saving a single precision bit. Following this operation a new soft sampling and labeling may be applied until N soft samples are accumulated in the M-bits labels' precision. Stage 922 is followed by stage 622. If the labels precision did not reach the maximal precision and additionally or alternatively, index i is smaller then N—stage 920 is followed by stage 622.

Figure 10:
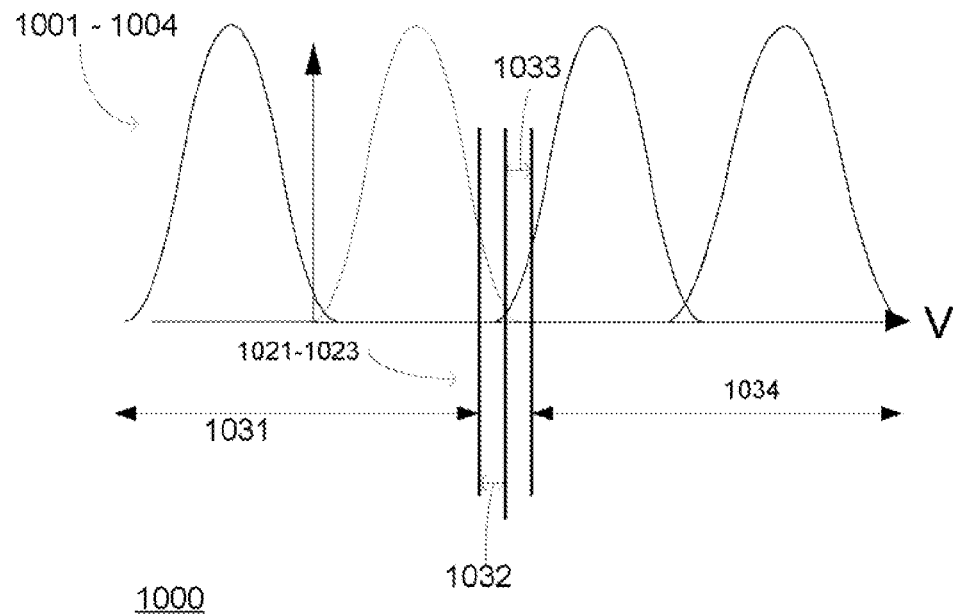
FIG. 10 illustrates a circuit according to an embodiment of the invention.
Figure 10:
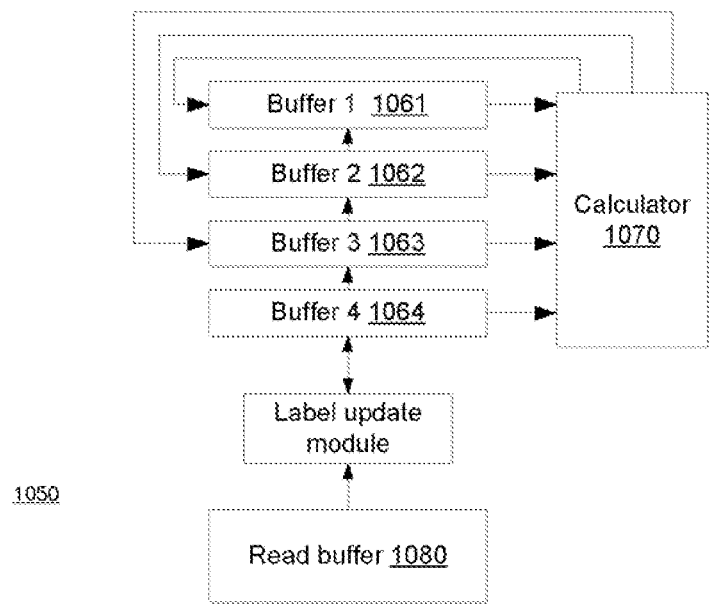

An example for combining using labeling and label truncation is illustrated in FIG. 10 and in table 1.

FIG. 10 illustrates circuit 1050 that may include four buffers 1061-1064, label update module 90, read buffer 1080 and calculator 1070.

Four-bit labels are stored in buffers 1-4 1061-1064—one bit of each label is stored in each of these buffers.

Table 1 illustrates an example of first labels, first LLR values, second labels, second LLR values, a combined LLR value (sum of first and second LLR values), a combined label (responsive to the combined LLR value) and a compressed label (compression of the combined label using truncation). These labels are associated with four voltage ranges 1011-1014 of a 2 bpc threshold voltage distribution 1000 that include four lobes 1001-1004, and three read thresholds 1021-1023 located in proximity to an overlap between second and third lobes 1002 and 1003 and are used to during MSB read attempts.

TABLE 1

| First label | First LLR value | Second label | Second LLR value | Combined LLR | Combined label | Compressed label |
|---|---|---|---|---|---|---|
| 0 | −2 | 0 | −2 | −4 | 0 | 0 |
| 1 | −1 | 0 | −2 | −3 | 1 | 1 |
| 2 | 1 | 0 | −2 | −1 | 3 | 3 |
| 3 | 2 | 0 | −2 | 0 | 4 | 4 |
| 0 | −2 | 1 | −1 | −3 | 1 | 1 |
| 1 | −1 | 1 | −1 | −2 | 2 | 2 |
| 2 | 1 | 1 | −1 | 0 | 4 | 4 |
| 3 | 2 | 1 | −1 | 1 | 5 | 5 |
| 0 | −2 | 2 | 1 | −1 | 3 | 3 |
| 1 | −1 | 2 | 1 | 0 | 4 | 4 |
| 2 | 1 | 2 | 1 | 2 | 6 | 6 |
| 3 | 2 | 2 | 1 | 3 | 7 | 7 |
| 0 | −2 | 3 | 2 | 0 | 4 | 4 |
| 1 | −1 | 3 | 2 | 1 | 5 | 5 |
| 2 | 1 | 3 | 2 | 3 | 7 | 7 |
| 3 | 2 | 3 | 2 | 4 | 8 | 7 |

Three read attempts are done each time a different threshold is used. Every read attempt is stored in read buffer 1080. Using the read result, the labels per cell are updated (by label update module 1090) in buffer 1 1061, and buffer 2 1062.

A second sampling of this page is done next, by reading using the same threshold. Again, every read attempt is stored in read buffer 1080. Using the read result, the labels per cell are updated (by label update module 1090) in buffer 3 1063, and buffer 4 1064.

Using these two sets of labels, calculator 1070 may calculate combined labels. Combined labels can replace the original labels and thus use buffers 1-3 1061-1063 or buffers 1-4 1061-1064 (depending on the combined result precision). The calculator 1070 can also apply a truncation operation to output a combined label of four-bits.

Referring to table 1—the first column can represent possible first label values of the initial soft sampling (stored in Buffer 1 1061 and Buffer 2 1062). The third column may hold possible label values of second sampling (stored in buffer 3 1063 and buffer 4 1064), and their corresponding LLR values are included in the fourth column. Each combination of first and second labels receives a new combined label (with a Combined LLR value). As may be noticed, there are 9 possible labels, which require 4 bits precision. A simple truncation which introduces a minimal degradation may be performed as suggested in the last column namely Truncated label. This way, the combined result can be stored using 3 bit precision.

Figure 11:
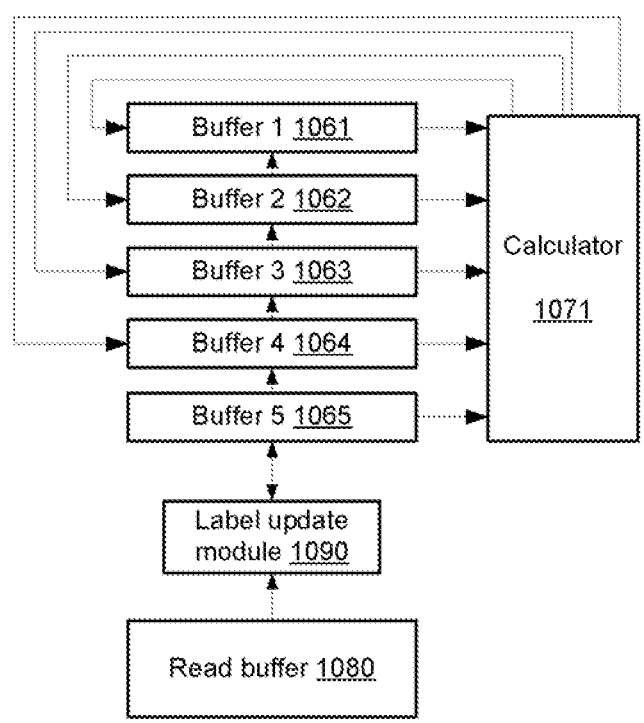
FIG. 11 illustrates a circuit according to an embodiment of the invention.
Figure 12:
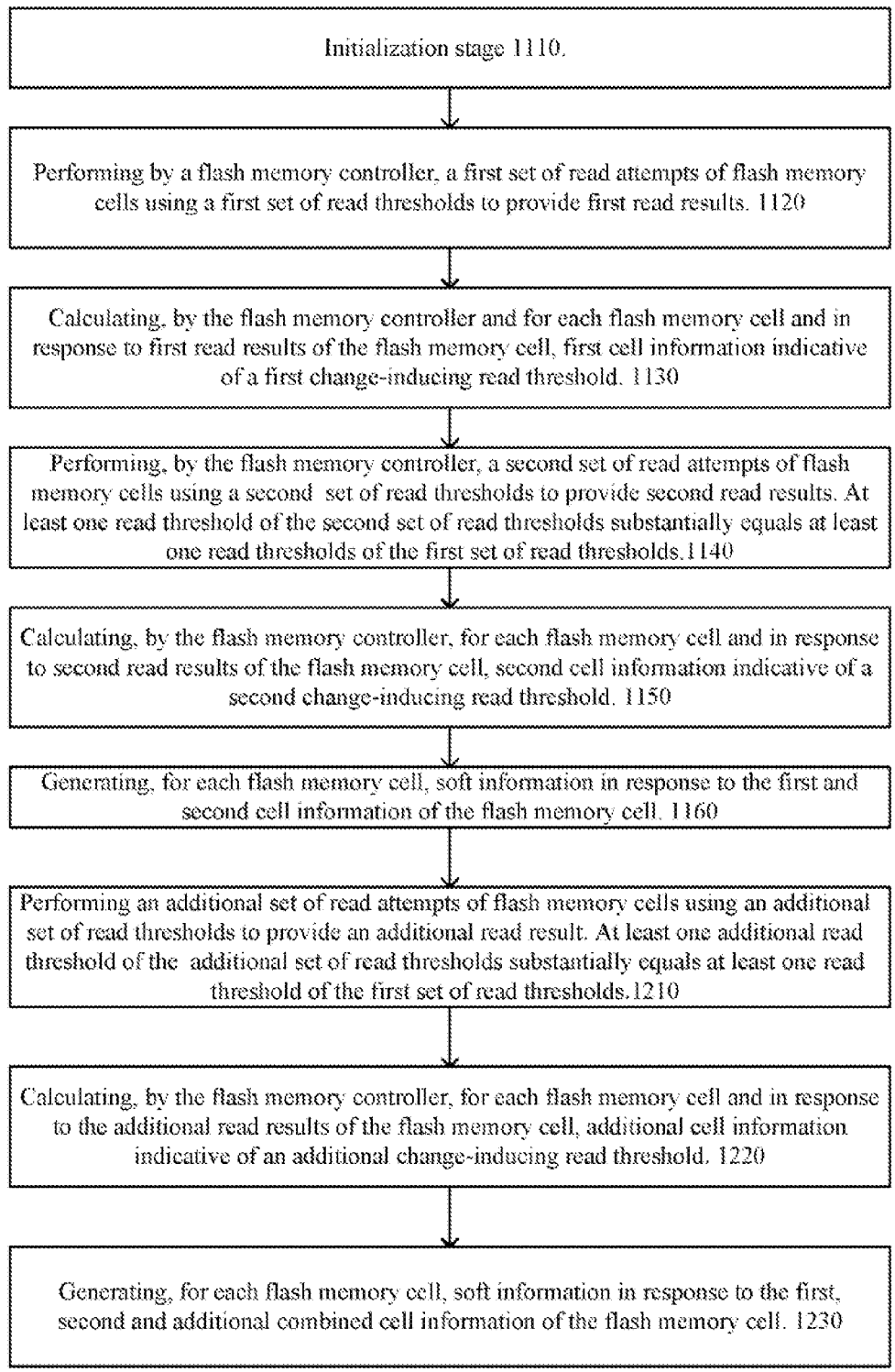
FIG. 12 illustrates a method according to an embodiment of the invention.

FIG. 11 and table 2 demonstrate a combining of labels of a sampling and two re-sampling operations according to an embodiment of the invention.

The outcome of the circuit 1050 of FIG. 10 and table 2 are referred to as first compressed label (column 1 of table 2) and first combined LLR values (column 2 of table 2).

These results are added to third labels (column 3 of table 2) or third LLR values (column 4 of table 2) obtained during a second re-sampling operation (which is the third soft sampling operation) to provide second combined labels (column 5 of table 2) or second combined LLR (column 6 of table 2).

The circuit 1051 of FIG. 11 includes buffers 1-5 1061-1065, read buffer 1080, label update module 1090 and calculator 1071.

Five-bit labels are stored in buffers 1-5—one bit per buffer.

Initial read results are stored in buffers 1-3 1061-1063, holding the 3-bit precision truncated labels.

Three read attempts are done each time a different threshold is used. Every read attempt is stored in read buffer 1080. Using the read result; the labels per cell are updated (by label update module 1090) in buffer 4 1064, and buffer 5 106.

Using the two labels (in buffers 1-3 1061-1063 and in buffers 4-5 1064-1065), a combined set of labels can be generated by calculator 1071. Combined labels can replace the original labels and thus use buffers 1-4 1061-1065. The combined labels can be truncated by calculator 1071.

As may be noticed, there are 12 possible labels, which require 4 bits precision, and thus may be stored in buffers 1-4 1061-1064 without any truncation. If truncation is needed, it is possible to reduce the number of possible labels, by for example dividing by 2 the combined LLR values and rounding to nearest integer.

TABLE 2

| First compressed labels (compressed sum of first and second labels) | First combined LLR values (of first and second sampling) | Third labels | Third LLR values | Second combined label | Second combined LLR |
|---|---|---|---|---|---|
| 0 | −4 | 0 | −2 | 0 | −6 |
| 0 | −4 | 1 | −1 | 1 | −5 |
| 0 | −4 | 2 | 1 | 3 | −3 |
| 0 | −4 | 3 | 2 | 4 | −2 |
| 1 | −3 | 0 | −2 | 1 | −5 |
| 1 | −3 | 1 | −1 | 2 | −4 |
| 1 | −3 | 2 | 1 | 4 | −2 |
| 1 | −3 | 3 | 2 | 5 | −1 |
| 2 | −2 | 0 | −2 | 2 | −4 |
| 2 | −2 | 1 | −1 | 3 | −3 |
| 2 | −2 | 2 | 1 | 5 | −1 |
| 2 | −2 | 3 | 2 | 6 | 0 |
| 3 | −1 | 0 | −2 | 3 | −3 |
| 3 | −1 | 1 | −1 | 4 | −2 |
| 3 | −1 | 2 | 1 | 6 | 0 |
| 3 | −1 | 3 | 2 | 7 | 1 |
| 4 | 0 | 0 | −2 | 4 | −2 |
| 4 | 0 | 1 | −1 | 5 | −1 |
| 4 | 0 | 2 | 1 | 7 | 1 |
| 4 | 0 | 3 | 2 | 8 | 2 |
| 5 | 1 | 0 | −2 | 5 | −1 |
| 5 | 1 | 1 | −1 | 6 | 0 |
| 5 | 1 | 2 | 1 | 8 | 2 |
| 5 | 1 | 3 | 2 | 9 | 3 |
| 6 | 2 | 0 | −2 | 6 | 0 |
| 6 | 2 | 1 | −1 | 7 | 1 |
| 6 | 2 | 2 | 1 | 9 | 3 |
| 6 | 2 | 3 | 2 | 10 | 4 |
| 7 | 3 | 0 | −2 | 7 | 1 |
| 7 | 3 | 1 | −1 | 8 | 2 |
| 7 | 3 | 2 | 1 | 10 | 4 |
| 7 | 3 | 3 | 2 | 11 | 5 |

The mapping to LLR values is not limited and LLR precision may be used according to the actual statistics.

As another embodiment of the invention, it is suggested to sample using nearby threshold values instead of the same read threshold, and apply the same combining methods, as described here.

FIG. 11 illustrates a method 1100 for generating soft information, according to an embodiment of the invention.

Method 1100 may include an initialization stage 1110. This stage may include determining how many re-sampling operation to perform (N), how each re-sampling operation should be executed (for example—setting K). Stage 1110 can include receiving information that indicates how many re-sampling operation to perform (N), how each re-sampling operation should be executed and the like.

For example—initialization stage may include selecting second read thresholds to be applied during a first re-sampling operation in response to reliabilities of first voltage ranges associated with first read thresholds utilized during a sampling operation.

Stage 1110 may be followed by stage 1120 of performing a sampling operation. This is denoted "performing by a flash memory controller, a first set of read attempts of flash memory cells using a first set of read thresholds to provide first read results".

Stage 1120 may be followed by stage 1130 of calculating, by the flash memory controller and for each flash memory cell and in response to first read results of the flash memory cell, first cell information indicative of a first change-inducing read threshold.

For each flash memory cell the first cell information may represent a first voltage range that starts by the first change-inducing read threshold. The second cell information represents a second voltage range that starts by the second change-inducing read threshold.

The first cell information may represent a reliability of the first voltage range such as but not limited to a first log likelihood ratio (LLR) value associated with the first voltage range.

For each flash memory cell the first cell information may include a first label that represents a location of the first voltage range.

Stage 1130 may be followed by performing one or more re-sampling operations.

FIG. 11 illustrates stage 1130 as being followed by a re-sampling stage 1140. Stage 1140 may include performing, by the flash memory controller, a second set of read attempts of flash memory cells using a second set of read thresholds to provide second read results.

At least one read threshold of the second set of read thresholds substantially equals at least one read thresholds of the first set of read thresholds.

Each read threshold of the second set of read thresholds is included in the first set of read thresholds. Thus the second set of read thresholds can equal the first set of read thresholds of can be a subset of the second set of read thresholds.

The first set of read thresholds virtually partitions a threshold voltage distribution of the group of flash memory cells to multiple first voltage ranges and wherein the second set of read thresholds virtually partitions the threshold voltage distribution of the group of flash memory cells to multiple second voltage ranges.

Stage 1140 may be followed by stage 1150 of calculating, by the flash memory controller, for each flash memory cell and in response to second read results of the flash memory cell, second cell information indicative of a second change-inducing read threshold.

The second cell information may include a second label that represents a location of the second voltage range.

The second cell information may represent a reliability of the second voltage range such as but not limited to a second log likelihood ratio (LLR) value associated with the second voltage range.

Stage 1150 may be followed by stage 1160 of generating, for each flash memory cell, soft information in response to the first and second cell information of the flash memory cell. This soft information can be an intermediate soft information (in case other re-sampling operation are to be executed) or a non-intermediate soft information.

Stage 1160 may include adding, for each flash memory cell, the first label and the second label to provide a combined label. The adding may include a coherent combining, for each flash memory cell, of the first label and the second label to provide the combined label. Stage 1160 may include compressing the combined label.

Stage 1160 may include adding, for each flash memory cell, the first LLR value and the second LLR value to provide a combined LLR value. Stage 1160 may include a coherent combining, for each flash memory cell, of the first LLR value and the second LLR value to provide a combined LLR value. Stage 1160 may include compressing the combined LLR value.

The amount of re-sampling operation can exceed one and this is illustrated by stages 1210, 1220 and 1230.

Stage 1210 may include performing an additional set of read attempts of flash memory cells using an additional set of read thresholds to provide an additional read result; wherein an additional read threshold of the additional set of read thresholds substantially equals at least one read thresholds of the first set of read thresholds.

Stage 1220 may include calculating, by the flash memory controller, for each flash memory cell and in response to the additional read results of the flash memory cell, additional cell information indicative of an additional change-inducing read threshold.

Stage 1230 may include generating, for each flash memory cell, soft information in response to the first, second and additional cell information of the flash memory cell.

Multiple repetitions of stage 1210-1230 may be provided (until reaching N).

It is noted that the number of read threshold can differ from one re-sampling operation to another and that the method may include evaluating whether to perform additional re-sampling operations (even before reaching N) based on soft or complete soft decoding attempts that use cell information and read results.

Figure 13:
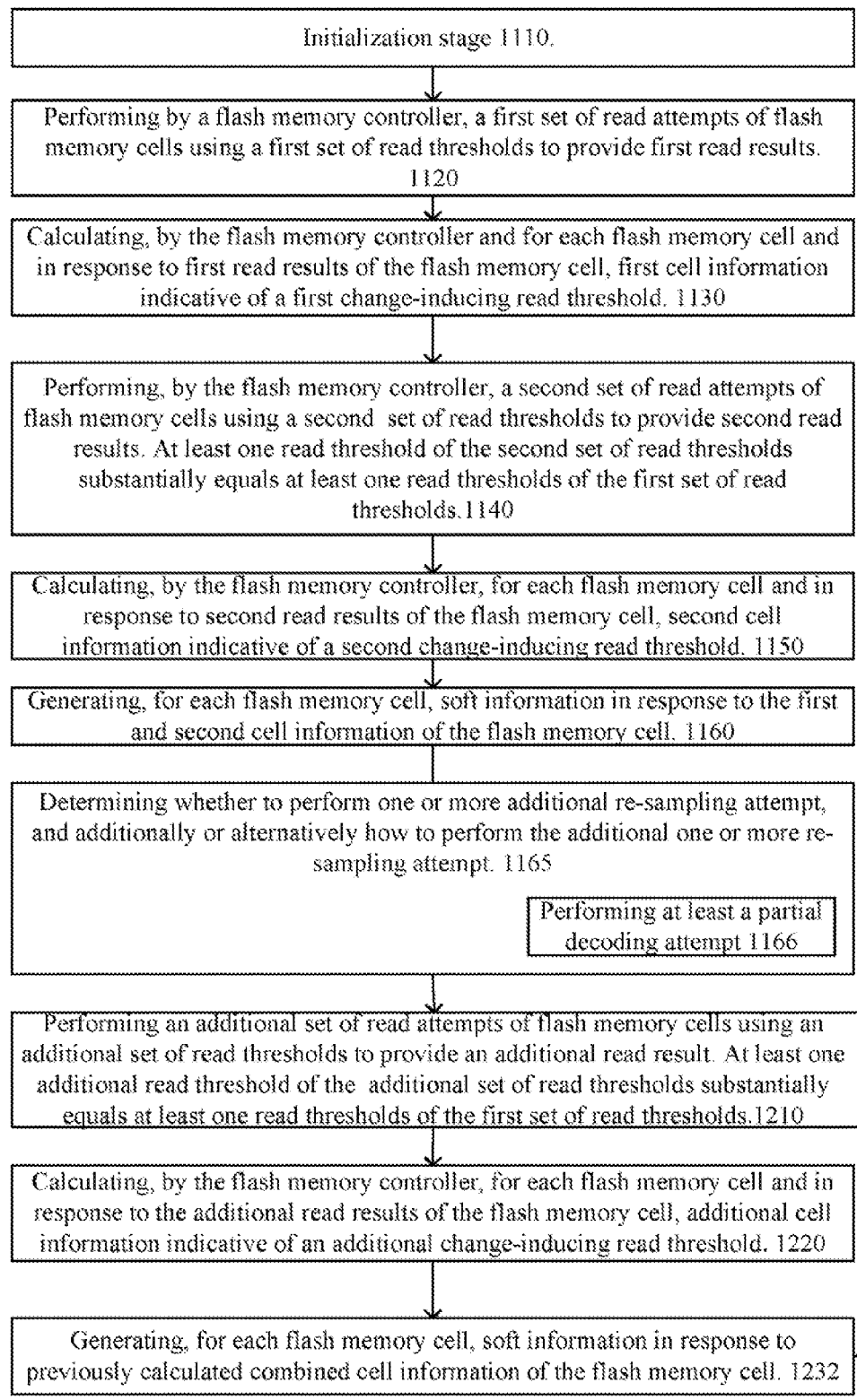
FIG. 13 illustrates a method according to an embodiment of the invention.

FIG. 13 illustrates method 1300 according to an embodiment of the invention.

Method 1300 differs from method 1200 by the inclusion of stage 1165 and the inclusion of stage 1232 instead of stage 1230.

Stage 1165 includes determining whether to perform one or more additional re-sampling attempt, and additionally or alternatively how to perform the additional one or more re-sampling attempt. Stage 1165 follows stage 1160 and only if it determined to perform one or more additional re-sampling operations it is followed by stage 1210. Stage 1165 may be responsive to an outcome of a partial or full decoding attempt (as illustrated by box 1166).

Stage 1323 includes generating, for each flash memory cell, soft information in response to previously calculated cell information of the flash memory cell. Stage 1232 follows stage 1220 and may be followed (if additional re-sampling operations are required) by stage 1210.

Figure 14:
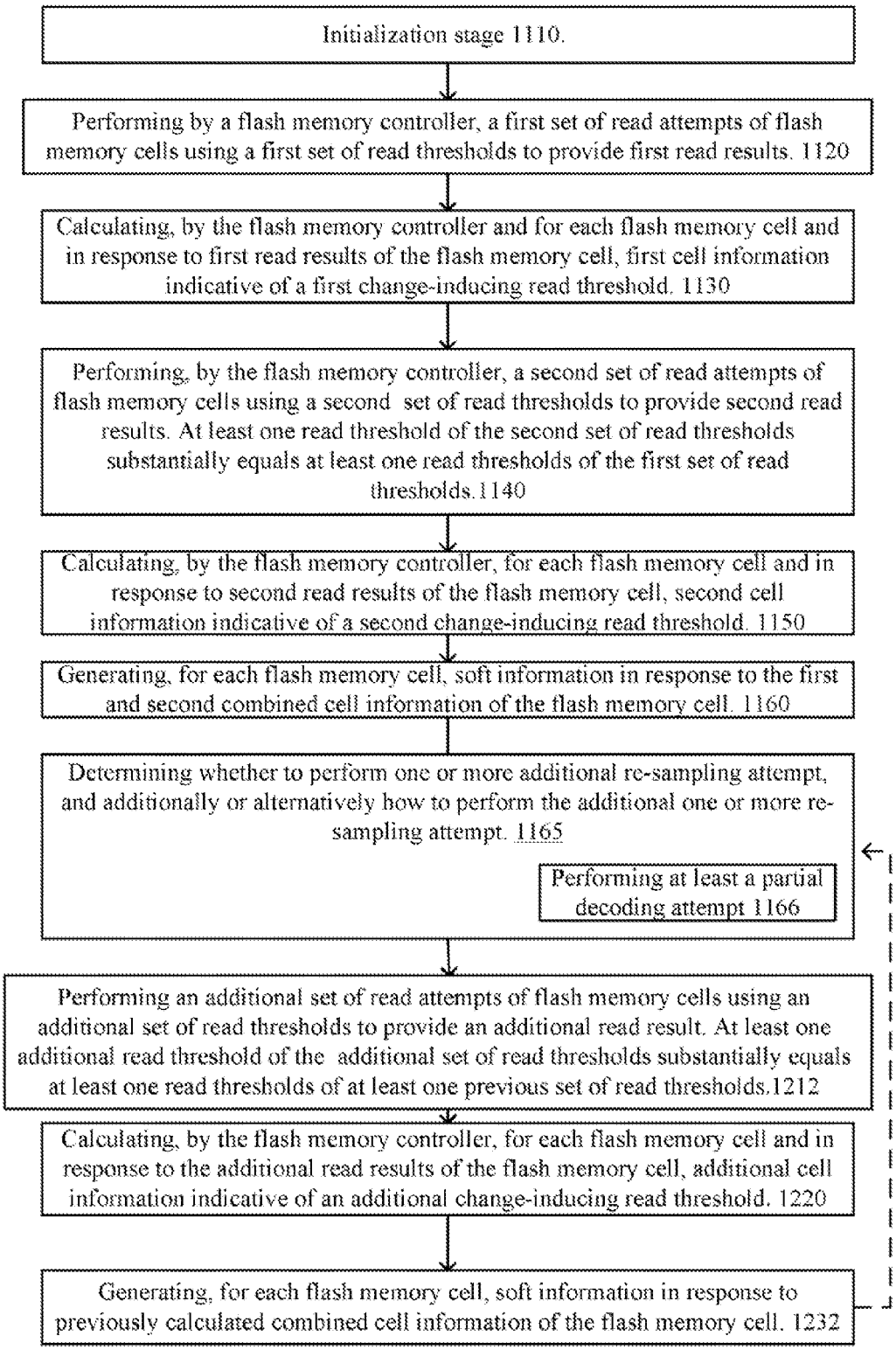
FIG. 14 illustrates a method according to an embodiment of the invention.

FIG. 14 illustrates method 1400 according to an embodiment of the invention.

Method 1400 differs from method 1300 by (A) having stage 1232 followed by stage 1165—thus each re-sampling operation can be followed by a determination whether to proceed and how to proceed, and by (B) having, instead of stage 1210, stage 1212 of performing an additional set of read attempts of flash memory cells using an additional set of read thresholds to provide an additional read result. At least one additional read threshold of the additional set of read thresholds substantially equals at least one read thresholds of at lest one previous set of read thresholds.

Figure 15:
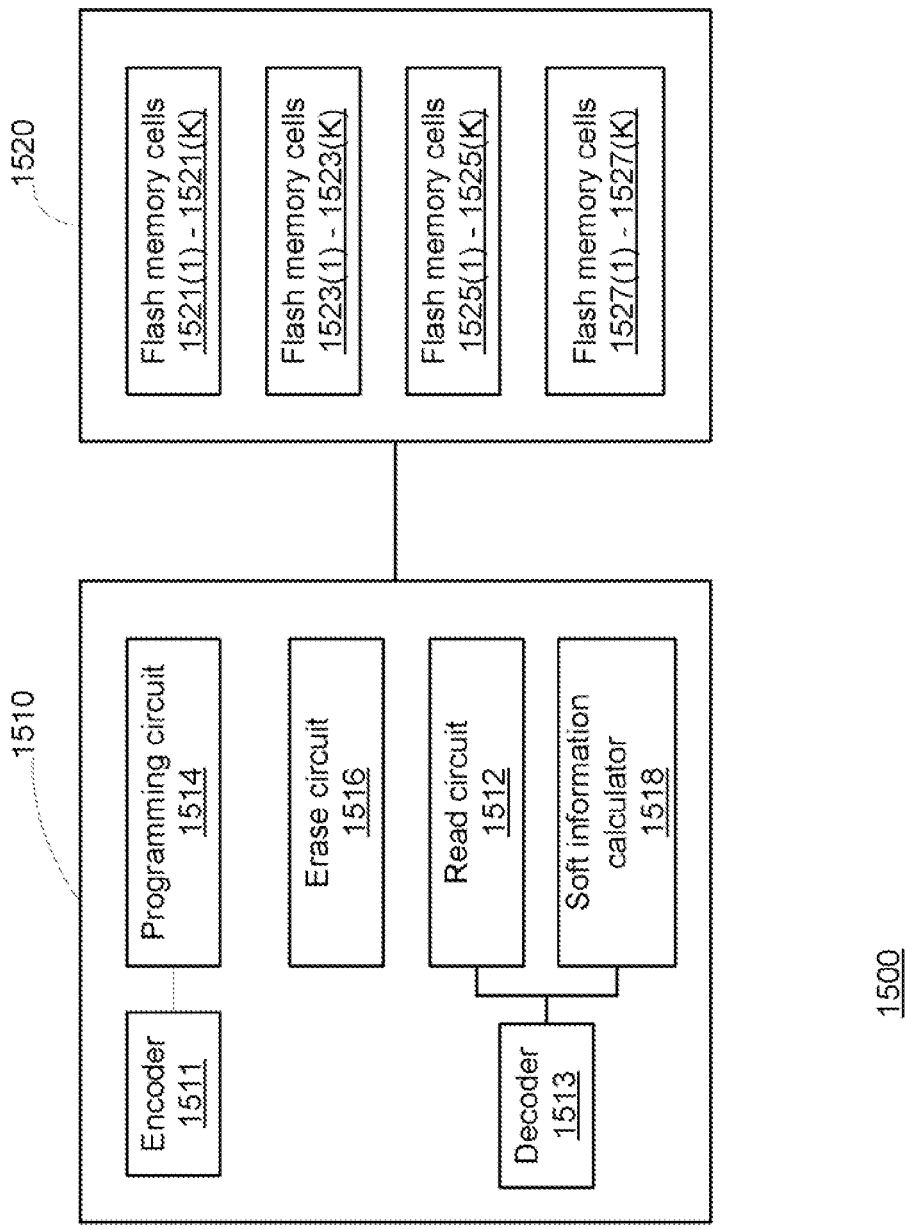
FIG. 15 illustrates a device according to an embodiment of the invention.

FIG. 15 illustrates system 1500 according to an embodiment of the invention.

System 1500 includes a flash memory module 1520 and a flash memory controller 1510. The flash memory module 1520 may include multiple sets of flash memory cells such as first set of flash memory cells 1521(1)-1521(K), second set of flash memory cells 1523(1)-1523(K), third set of flash memory cells 1525(1)-1525(K) and forth set of flash memory cells 1527(1)-1527(K). Each set of flash memory cells can be a page, an erase block, a portion of a page, multiple pages, a portion of an erase block or a combination of erase blocks. Each set of flash memory cells can be sampled and re-sampled by any of the mentioned above methods.

The flash memory controller 1510 has a read circuit 1512, a programming circuit 1514, an erase circuit 1516 and a soft information calculator 1518, an encoder 1511 for the input data which goes to programmer, and a decoder 1513 that is arranged to perform a decoding process (may be partial soft decoding, partial hard decoding, full soft decoding or full hard decoding) based upon information such as soft information that is received from the read circuit 1512 or the soft information calculator 1518. The decoder 1513 provide inputs for the soft information calculator 1518.

The soft information calculator 1518 can include any of the circuits of FIGS. 7, 10 and 11 and may be arranged to calculate any kind of cell information and to provide soft information that can be used for soft decoding.

The system can execute any of the methods mentioned above.

For example, the read circuit 1512 may be arranged to perform a first set of read attempts of flash memory cells using a first set of read thresholds to provide first read results and perform a second set of read attempts of the flash memory cells using a second set of read thresholds to provide second read results; wherein at least one read threshold of the second set of read thresholds substantially equals at least one read threshold of the first set of read thresholds.

The soft information circuit 1518 may be arranged to calculate, for each flash memory cell of the flash memory cells and in response to the first read results, first cell information indicative of a first change-inducing read threshold; calculate, for each flash memory cell of the flash memory cells and in response to the second read results, second cell information indicative of a second change-inducing read threshold; and generate, for each flash memory cell of the flash memory cells, soft information in response to the first cell information and the second cell information of the flash memory cell.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for generating soft information, the method comprising: performing by a flash memory controller a first set of read attempts of flash memory cells using a first set of read thresholds to provide first read results; calculating, by the flash memory controller, for each flash memory cell of the flash memory cells and in response to the first read results, first cell information indicative of a first change-inducing read threshold; performing by the flash memory controller a second set of read attempts of the flash memory cells using a second set of read thresholds to provide second read results; wherein at least one read threshold of the second set of read thresholds substantially equals at least one read threshold of the first set of read thresholds; calculating, by the flash memory controller, for each flash memory cell of the flash memory cells and in response to the second read results, second cell information indicative of a second change-inducing read threshold; and generating, for each flash memory cell of the flash memory cells, soft information in response to the first cell information and the second cell information of the flash memory cell;
wherein the first set of read thresholds virtually partitions a threshold voltage distribution of the flash memory cells to multiple first voltage ranges; and
wherein the second set of read thresholds virtually partitions the threshold voltage distribution of the flash memory cells to multiple second voltage ranges.

2. The method according to claim 1 wherein each read threshold of the second set of read thresholds is included in the first set of read thresholds.

3. The method according to claim 2, wherein the first cell information of each flash memory cell represents a first voltage range that starts by the first change-inducing read threshold; and wherein the second cell information of each flash memory cell represents a second voltage range that starts by the second change-inducing read threshold.

4. The method according to claim 3, wherein the first cell information comprises a first label that represents a location of the first voltage range and wherein the second cell information comprises a second label that represents a location of the second voltage range.

5. The method according to claim 4, wherein the generating of the soft information comprises adding, for each flash memory cell, the first label and the second label to provide a combined label.

6. The method according to claim 5, wherein the adding comprises a coherent combining, for each flash memory cell, the first label and the second label of the flash memory cell to provide the combined label of the flash memory cell.

7. The method according to claim 4, comprising compressing the combined label of each flash memory cell.

8. The method according to claim 4, comprising feeding the first label and the second label of each flash memory cell of the multiple flash memory cells to a lookup table that outputs a combined label.

9. The method according to claim 3, wherein the first cell information represents a reliability of the first voltage range and wherein the second cell information represents a reliability of the second voltage range.

10. The method according to claim 3, wherein the first cell information comprises a first log likelihood ratio (LLR) value associated with the first voltage range.

11. The method according to claim 10, wherein the generating of the soft information comprises adding, for each flash memory cell, the first LLR value and the second LLR value to provide a combined LLR value.

12. The method according to claim 11, wherein the adding comprises a coherent combining, for each flash memory cell, of the first LLR value and the second LLR value to provide a combined LLR value.

13. The method according to claim 12, comprising compressing the combined LLR value.

14. The method according to claim 1, wherein the second set of read thresholds is a subset of the first set of read thresholds and wherein the method comprises selecting the second read thresholds in response to an estimated reliability of first voltage ranges.

15. The method according to claim 14, comprising selecting second read thresholds associated with first voltage ranges that exhibit a reliability that is smaller than a reliability threshold.

16. A method for generating soft information, the method comprising: performing by a flash memory controller a first set of read attempts of flash memory cells using a first set of read thresholds to provide first read results; calculating, by the flash memory controller, for each flash memory cell of the flash memory cells and in response to the first read results, first cell information indicative of a first change-inducing read threshold; performing by the flash memory controller a second set of read attempts of the flash memory cells using a second set of read thresholds to provide second read results; wherein at least one read threshold of the second set of read thresholds substantially equals at least one read threshold of the first set of read thresholds; calculating, by the flash memory controller, for each flash memory cell of the flash memory cells and in response to the second read results, second cell information indicative of a second change-inducing read threshold; generating, for each flash memory cell of the flash memory cells, soft information in response to the first cell information and the second cell information of the flash memory cell; and determining an amount of second read thresholds to be applied during the second set of read attempts based upon an outcome of an at least partial soft decoding attempt that is applied on the first read results.

17. A method for generating soft information, the method comprising: performing by a flash memory controller a first set of read attempts of flash memory cells using a first set of read thresholds to provide first read results; calculating, by the flash memory controller, for each flash memory cell of the flash memory cells and in response to the first read results, first cell information indicative of a first change-inducing read threshold; performing by the flash memory controller a second set of read attempts of the flash memory cells using a second set of read thresholds to provide second read results; wherein at least one read threshold of the second set of read thresholds substantially equals at least one read threshold of the first set of read thresholds; calculating, by the flash memory controller, for each flash memory cell of the flash memory cells and in response to the second read results, second cell information indicative of a second change-inducing read threshold; generating, for each flash memory cell of the flash memory cells, soft information in response to the first cell information and the second cell information of the flash memory cell; and performing an additional set of read attempts of the flash memory cells using an additional set of read thresholds to provide additional read results; wherein at least one additional read threshold of the additional set of read thresholds substantially equals at least one read thresholds of the first set of read thresholds;

calculating, by the flash memory controller, for each flash memory cell and in response to the additional read results, additional cell information indicative of an additional change-inducing read threshold; and generating, for each flash memory cell, soft information in response to the first, second and additional cell information of the flash memory cell.

18. The method according to claim 17, comprising:

performing at least a partial soft decoding attempt after a completion of a re-sampling iteration; wherein the re-sampling iteration comprises the performing of the additional set of read attempts, the calculating of the additional cell information and the generating of the soft information; and determining whether to perform a further re-sampling iteration based upon an amount of success of the at least partial soft decoding attempt.

19. The method according to claim 17 comprising determining to perform the further re-sampling iteration until the at least partial soft decoding attempt succeeds.

20. A method for generating soft information, the method comprising: performing by a flash memory controller a first set of read attempts of flash memory cells using a first set of read thresholds to provide first read results; calculating, by the flash memory controller, for each flash memory cell of the flash memory cells and in response to the first read results, first cell information indicative of a first change-inducing read threshold; performing by the flash memory controller a second set of read attempts of the flash memory cells using a second set of read thresholds to provide second read results; wherein at least one read threshold of the second set of read thresholds substantially equals at least one read threshold of the first set of read thresholds; calculating, by the flash memory controller, for each flash memory cell of the flash memory cells and in response to the second read results, second cell information indicative of a second change-inducing read threshold; generating, for each flash memory cell of the flash memory cells, soft information in response to the first cell information and the second cell information of the flash memory cell; and determining at least one parameter of the second set of read attempts in response to a state of the flash memory cells.

21. A non-transitory computer readable medium that stores instructions for:

performing, by a flash memory controller, a first set of read attempts of flash memory cells using a first set of read thresholds to provide first read results;

calculating, by the flash memory controller, for each flash memory cell of the flash memory cells and in response to the first read results, first cell information indicative of a first change-inducing read threshold;

performing, by the flash memory controller, a second set of read attempts of the flash memory cells using a second set of read thresholds to provide second read results;

wherein at least one read threshold of the second set of read thresholds substantially equals at least one read threshold of the first set of read thresholds;

calculating, by the flash memory controller, for each flash memory cell of the flash memory cells and in response to the second read results, second cell information indicative of a second change-inducing read threshold; and generating, for each flash memory cell of the flash memory cells, soft information in response to the first cell information and the second cell information of the flash memory cell;

wherein the first set of read thresholds virtually partitions a threshold voltage distribution of the flash memory cells to multiple first voltage ranges; and wherein the second set of read thresholds virtually partitions the threshold voltage distribution of the flash memory cells to multiple second voltage ranges.

22. A system comprising a flash memory controller, the flash memory controller comprises:

a read circuit that is arranged to perform:

a first set of read attempts of flash memory cells using a first set of read thresholds to provide first read results;

a second set of read attempts of the flash memory cells using a second set of read thresholds to provide second read results; wherein at least one read threshold of the second set of read thresholds substantially equals at least one read threshold of the first set of read thresholds;

a soft information circuit arranged to:

calculate, for each flash memory cell of the flash memory cells and in response to the first read results, first cell information indicative of a first change-inducing read threshold;

calculate, for each flash memory cell of the flash memory cells and in response to the second read results, second cell information indicative of a second change-inducing read threshold; and generate, for each flash memory cell of the flash memory cells, soft information in response to the first cell information and the second cell information of the flash memory cell;

wherein the first set of read thresholds virtually partitions a threshold voltage distribution of the flash memory cells to multiple first voltage ranges; and wherein the second set of read thresholds virtually partitions the threshold voltage distribution of the flash memory cells to multiple second voltage ranges.

* * * * *